(12) United States Patent
Kim et al.

(10) Patent No.: US 11,789,359 B2
(45) Date of Patent: Oct. 17, 2023

(54) METHOD FOR MANUFACTURING PELLICLE FOR EXTREME ULTRAVIOLET LITHOGRAPHY HAVING GRAPHENE DEFECT HEALING LAYER

(71) Applicant: KOREA ELECTRONICS TECHNOLOGY INSTITUTE, Seongnam-si (KR)

(72) Inventors: Hyeong Keun Kim, Yongin-si (KR); Hyun Mi Kim, Seoul (KR); Jin Woo Cho, Seoul (KR); Seul Gi Kim, Yongin-si (KR); Jun Hyeok Jeon, Suwon-si (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 141 days.

(21) Appl. No.: 17/539,942

(22) Filed: Dec. 1, 2021

(65) Prior Publication Data

US 2022/0171278 A1   Jun. 2, 2022

(30) Foreign Application Priority Data

Dec. 2, 2020 (KR) .......................... 10-2020-0166699

(51) Int. Cl.
*G03F 1/62* (2012.01)

(52) U.S. Cl.
CPC ...................................... *G03F 1/62* (2013.01)

(58) Field of Classification Search
CPC ...................................... G03F 1/62; G03F 1/64
USPC ............................................................ 430/5
See application file for complete search history.

(56) References Cited

FOREIGN PATENT DOCUMENTS

| JP | 2020-098227 A | 6/2020 |
|---|---|---|
| KR | 10-1792409 B1 | 10/2017 |
| KR | 10-2018-0072786 A | 6/2018 |
| KR | 10-2018-0075898 A | 7/2018 |
| KR | 10-18787330 B1 | 7/2018 |
| KR | 10-2018-0103505 A | 9/2018 |
| KR | 10-2018-0135490 A | 12/2018 |
| KR | 10-2019-0053706 A | 5/2019 |
| KR | 10-2020-0112756 A | 10/2020 |
| KR | 10-2020-0126216 A | 11/2020 |

OTHER PUBLICATIONS

Office Action dated Apr. 22, 2021 in Korean Application No. 10-2020-0148420.
Office Action dated Apr. 21, 2021 In Korean Application No. 10-2020-0149813.
Notice of Allowance dated Jul. 19, 2021 in Korean Application No. 10-2020-0149813.
Office Action dated Apr. 22, 2021 in Korean Application No. 10-2020-0166699.
Notice of Allowance dated Oct. 15, 2021 in Korean Application No. 10-2020-0166699.

*Primary Examiner* — Christopher G Young
(74) *Attorney, Agent, or Firm* — Knobbe, Martens, Olson & Bear, LLP

(57) ABSTRACT

This application relates to a method for manufacturing a pellicle for extreme ultraviolet lithography. In one aspect, the method includes forming a support layer of a silicon nitride material on a silicon substrate, and forming a core layer of a graphene material on the support layer. The method may also include forming a graphene defect healing layer on the core layer by selectively forming a material of $MeO_xN_y$ (Me is one of Si, Al, Ti, Zr, and Hf, x+y=2) at a grain boundary of the core layer in an atomic layer deposition process using heat in order to heal defects generated in graphene forming the core layer without additional damage to the graphene. The method may further include a capping layer on the graphene defect healing layer, wherein a central portion of the silicon substrate under the support layer is removed to form an opening partially exposing the support layer.

8 Claims, 48 Drawing Sheets

METHOD FOR MANUFACTURING PELLICLE FOR EXTREME ULTRAVIOLET LITHOGRAPHY HAVING GRAPHENE DEFECT HEALING LAYER

CROSS-REFERENCE TO RELATED APPLICATION

The present application claims priority to Korean Patent Application No. 10-2020-0166699 filed on Dec. 2, 2020 in the Korean Intellectual Property Office, which is incorporated herein in its entirety by reference.

BACKGROUND

Technical Field

The present disclosure relates to a semiconductor lithography technology, and more particularly, to a method for manufacturing a pellicle for extreme ultraviolet lithography having a graphene defect healing layer for healing defects generated in graphene used as a core layer.

Description of Related Technology

As the semiconductor industry continues to develop and the degree of semiconductor integration is dramatically improved, electronic devices are becoming smaller and lighter. In order to further improve the degree of semiconductor integration, the advancement of lithography technology is required.

Currently, technology is developing toward realizing a fine pattern of a semiconductor by reducing the wavelength of a light source. Extreme ultraviolet (EUV) lithography technology, recently developed as a next-generation technology, can realize a fine pattern through a single resist process.

SUMMARY

The present disclosure provides a method for manufacturing a pellicle for extreme ultraviolet lithography including a graphene defect healing layer capable of healing defects generated in graphene used as a core layer.

In addition, the present disclosure provides a method for manufacturing a pellicle for extreme ultraviolet lithography including a graphene defect healing layer capable of healing defects generated in graphene used as a core layer without additional damage to the graphene.

In addition, the present disclosure provides a method for manufacturing a pellicle for extreme ultraviolet lithography having a graphene defect healing layer by effectively removing residues generated in a process of forming graphene as a core layer.

According to embodiments of the present disclosure, a method for manufacturing a pellicle for extreme ultraviolet lithography including a graphene defect healing layer may include forming a support layer of a silicon nitride material on a silicon substrate, forming a core layer of a graphene material on the support layer, forming a graphene defect healing layer on the core layer by selectively forming a material of $MeO_xN_y$ (Me is one of Si, Al, Ti, Zr, and Hf, x+y=2) at a grain boundary of the core layer in an atomic layer deposition (ALD) process using heat in order to heal defects generated in graphene forming the core layer without additional damage to the graphene, forming a capping layer on the graphene defect healing layer in the ALD process, and removing a central portion of the silicon substrate under the support layer to form an opening through which the support layer is partially exposed.

In the method, forming the core layer may include forming a few-layer graphene on the support layer, forming a metal catalyst layer on the few-layer graphene, forming an amorphous carbon layer on the metal catalyst layer, and directly growing a multi-layer graphene from the few-layer graphene used as a seed layer by interlayer exchange between the metal catalyst layer and the amorphous carbon layer through heat treatment, wherein carbon in the amorphous carbon layer passes through the metal catalyst layer and is moved to the few-layer graphene.

The support layer may be formed to a thickness of 10 nm or less in a low pressure chemical vapor deposition (LPCVD) process.

The method may further include removing a residue generated in a process of forming the core layer by performing ozone pre-treatment through the ALD process between forming the core layer and forming the graphene defect healing layer.

The graphene defect healing layer may be formed to a thickness of 1 nm to 3 nm in the ALD process using heat.

A material of the graphene defect healing layer may be a three-component material containing Me, O, and N.

A material of the graphene defect healing layer may be one of SiON, AlON, TiON, ZrON, and HfON.

The capping layer may include $SiN_x$, SiC, $B_4C$, BN, or $MoSi_2$.

The capping layer may be formed to a thickness of 10 nm or less in the ALD process.

According to embodiments of the present disclosure, by forming the graphene defect healing layer for covering the core layer after forming graphene as the core layer, it is possible to heal defects of the graphene forming the core layer. Therefore, the pellicle according to the present disclosure can provide thermal stability, mechanical stability, and chemical durability while having an extreme ultraviolet transmittance of 85% or more in an extreme ultraviolet output environment of 350 W or more.

Because the graphene defect healing layer is formed in the ALD process using heat instead of plasma, defects occurring in the graphene can be healed without additional damage to the graphene forming the core layer.

In addition, because the ozone pre-treatment is performed through the ALD process using heat before the graphene defect healing layer is formed, residues generated in the process of forming the graphene as the core layer can be effectively removed. Therefore, it is possible to uniformly form the graphene defect healing layer on the core layer as a whole.

In addition, because the capping layer is formed on the graphene defect healing layer in the ALD process, the core layer can be protected from outgassing generated during extreme ultraviolet lithography.

DETAILED DESCRIPTION

Figure 1:
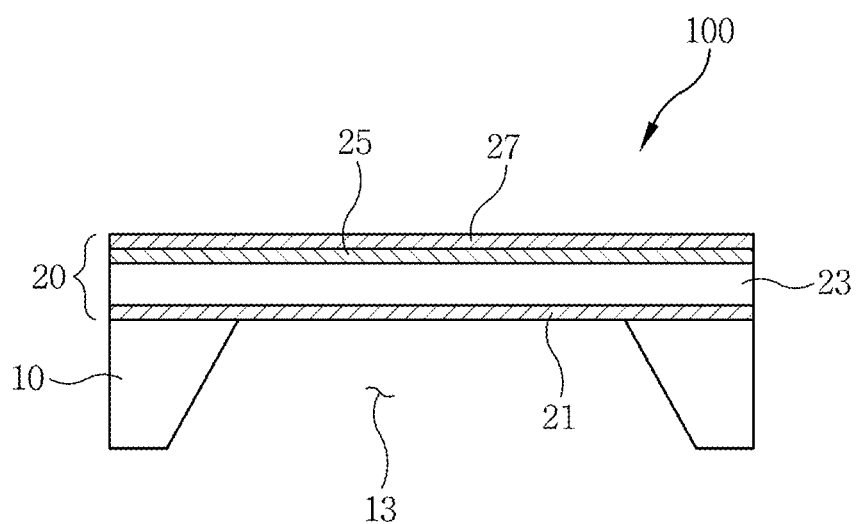
FIG. 1 is a cross-sectional view showing a pellicle for extreme ultraviolet lithography having a graphene defect healing layer according to the present disclosure.

An extreme ultraviolet lithography apparatus used in a semiconductor process includes a light source power, a resist, a pellicle, and a mask. The pellicle is installed on the mask to prevent contaminants generated during the lithography process from adhering to the mask, and is selectively used depending on the lithography apparatus.

In the extreme ultraviolet lithography process, there was an expectation that the pellicle would not be needed because a clean system was built. However, it has been known that during an actual operation after the construction of the lithography apparatus, contamination of the mask is caused by foreign substances generated from an internal driving unit of the apparatus, particles of tin generated in the oscillation of the light source, and extreme ultraviolet photoresist.

Therefore, in the extreme ultraviolet lithography process, the pellicle is recognized as an essential component so as to prevent contamination of the mask. When the pellicle is used, defects smaller than 10,000 nm in size are negligible.

The pellicle for extreme ultraviolet lithography is required to have a size of 110 mm×144 mm to cover the mask, and an extreme ultraviolet transmittance of 85% or more is required in order to minimize deterioration of productivity due to loss of a light source. In addition, mechanical stability that the pellicle is not damaged by physical movement up to 20 G inside the extreme ultraviolet lithography apparatus, and thermal stability that the pellicle can withstand a thermal load of 250 W or more based on a 5 nm node are required. Also, chemical durability that the pellicle does not react to hydrogen radicals generated in an extreme ultraviolet environment is required.

Currently, pellicle development companies are developing transmissive materials based on polycrystalline silicon (p-Si) or SiN. However, such materials do not satisfy a transmittance of 85% or more, which is the most important condition of a pellicle for extreme ultraviolet lithography. Also, such materials have weaknesses in thermal stability, mechanical stability, and chemical durability in an extreme ultraviolet lithography environment, so that process development research is being conducted to supplement their properties. For example, materials such as Mo, Ru, and Zr have been selected and studied as materials for solving the problems of SiN-based materials, but it is difficult to manufacture a thin film and maintain its shape.

In order to address the above-discussed issue, a graphene-based pellicle for extreme ultraviolet lithography has been introduced. Graphene has a transmittance of 85% or more for extreme ultraviolet rays. In addition, graphene has very high tensile strength when base planes are uniformly arranged in the areal direction, so it can satisfy all characteristic indicators such as high transmittance, thermal stability, and mechanical stability.

However, due to the complexity of a manufacturing process and the difficulty in quality control, graphene has not yet been implemented with a full-size membrane.

In a process of forming the graphene as a core layer of the pellicle, residues are generated, and these residues deteriorate the quality of the core layer.

In addition, because the graphene used for the core layer is formed as a thin film having a thickness of several tens of nanometers, defects may occur in the process of forming the graphene. Such graphene defects may deteriorate the thermal stability, mechanical stability, and chemical durability of the pellicle.

In order to compensate for or heal the defects of graphene, a method of depositing a capping layer on the graphene may be considered. However, in case of using plasma to deposit the capping layer, damage to graphene may be further caused by the plasma.

Hereinafter, an embodiment of the present disclosure will be described in detail with reference to the accompanying drawings. The present disclosure may, however, be embodied in many different forms and should not be construed as being limited to the embodiment set forth herein. Rather, this embodiment is provided so that the disclosure will be thorough and complete and will fully convey the scope of the disclosure to those skilled in the art. Accordingly, an embodiment described herein should be understood to include various modifications, equivalents, and/or alternatives.

In addition, techniques that are well known in the art and not directly related to the present disclosure are not described herein. This is to clearly convey the subject matter of the present disclosure by omitting an unnecessary explanation. Also, the terms are merely used for describing a particular embodiment but do not limit the embodiment. Singular forms are intended to include plural forms unless the context clearly indicates otherwise.

Pellicle for Extreme Ultraviolet Lithography

FIG. 1 is a cross-sectional view showing a pellicle for extreme ultraviolet lithography having a graphene defect healing layer according to the present disclosure.

Referring to FIG. 1, a pellicle 100 for extreme ultraviolet lithography according to the present disclosure (hereinafter referred to as 'pellicle') includes a silicon substrate 10 and a pellicle layer 20. The silicon substrate 10 has an opening 13 formed in a central portion. The pellicle layer 20 is formed on the silicon substrate 10 so as to cover the opening 13. The pellicle layer 20 includes a support layer 21, a core layer 23, a graphene defect healing layer 25, and a capping layer 27. The support layer 21 is made of a silicon nitride material and formed on the silicon substrate 10 to cover the opening 13. The core layer 23 is made of a graphene material and formed on the support layer 21. The graphene defect healing layer 25 is formed on the core layer 23 and heals defects in the graphene forming the core layer 23. The capping layer 27 is formed on the graphene defect healing layer 25.

Because of including the graphene defect healing layer 25 formed on the core layer 23 of the graphene material, the pellicle 100 according to the present disclosure can heal the defects of the graphene forming the core layer 23. Accordingly, the pellicle 100 according to the present disclosure can provide thermal stability, mechanical stability, and chemical durability while having an extreme ultraviolet transmittance of 85% or more in an extreme ultraviolet output environment of 350 W or more.

The pellicle 100 is a consumable component that protects a mask from contaminants in a lithography process for semiconductor or display manufacturing. That is, the pellicle 100 is a thin film overlying the mask and serves as a cover. Because the light transferred to the wafer is focused with the mask in a lithographic exposure, even if contaminants exist on the pellicle 100 that is separated by a certain distance, it is possible to minimize a problem of forming a defective pattern due to out of focus.

As such, the pellicle 100 may minimize defective patterns while protecting the mask from contaminants during the exposure process, thereby greatly increasing the yield of semiconductor or display manufacturing. In addition, the use of the pellicle 100 can increase the lifespan of the mask.

Now, the pellicle 100 according to the present disclosure will be described in detail.

The silicon substrate 10 supports the pellicle layer 20 and makes it easy to handle and transport the pellicle 100 during and after the process of manufacturing the pellicle 100. The opening 13 in the central portion of the silicon substrate 10 may be formed using a micro-machining technique such as micro-electro mechanical systems (MEMS). Although the silicon substrate 10 is used exemplarily in the present disclosure, any other substrate made of quartz, a silicon on insulator (SOI), or the like may be used alternatively.

The pellicle layer 20 is formed on the silicon substrate 10. The pellicle layer 20 includes the support layer 21, the core layer 23, the graphene defect healing layer 25, and the capping layer 27.

The support layer 21 is a layer that supports the core layer 23, and is formed of a silicon nitride material on the silicon substrate 10. The material of the support layer 21 may be represented by $SiN_x$. For example, the support layer 21 may be formed of $Si_3N_4$. The support layer 21 may be formed to a thickness of 10 nm or less in a low pressure chemical vapor deposition (LPCVD) process.

The core layer 23 is a layer that determines the transmittance of extreme ultraviolet rays, and is formed of graphene. The core layer 23 has a transmittance of 85% or more for extreme ultraviolet rays, and effectively dissipates heat to prevent overheating. The core layer 23 may be formed to a thickness of 10 nm or less.

The core layer 23 may be single-layer graphene or multi-layer graphene. The graphene forming the core layer 23 may be formed by a direct growth method or a transfer method.

The transfer method is a method of growing graphene on a nickel thin film or a copper thin film in a CVD process and then transferring the grown graphene onto the support layer to form the core layer 23.

The direct growth method is a method of directly growing the core layer 23 on the support layer 21. For example, after a few-layer graphene, a metal catalyst layer, and an amorphous carbon layer are sequentially formed on the support layer 21, heat treatment is performed. Then, carbon in the amorphous carbon layer is moved into the few-layer graphene by the interlayer exchange principle between the metal catalyst layer and the amorphous carbon layer, thereby directly growing multi-layer graphene to form the core layer 23. Here, the few-layer graphene refers to one to five layers of graphene, and the multi-layer graphene refers to graphene having two or more layers.

In a process of forming the core layer 23 with graphene, a residue may exist on the core layer 23. Such residues can be removed by performing ozone pre-treatment through an atomic layer deposition (ALD) process.

The graphene defect healing layer 25 is formed on the core layer 23. The material of the graphene defect healing layer 25 may include Si, $SiO_2$, $Al_2O_3$, $TiO_2$, $ZrO_2$, $HfO_2$, $ZrSi_2$, $MoSi_2$, BN, Ru, Pt, or $MeO_xN_y$ (Me is one of Si, Al, Ti, Zr, and Hf, x+y=2). In order not to damage the core layer 23 in a process of forming the graphene defect healing layer 25, the graphene defect healing layer 25 is formed in an ALD process using heat instead of plasma. That is, a material for forming the graphene defect healing layer 25 in the ALD process is selectively deposited on a grain boundary of the core layer 23, thereby healing the defects of graphene forming the core layer 23.

In order for the pellicle layer 20 to provide thermal stability, mechanical stability, and chemical durability while having an extreme ultraviolet transmittance of 85% or more in an extreme ultraviolet output environment of 350 W or more, the graphene defect healing layer 25 may be formed to have a thickness of 1 nm to 3 nm.

In addition, the capping layer 27 provides thermal stability, mechanical stability, and chemical durability to the pellicle layer 20 while minimizing a decrease in the extreme ultraviolet transmittance of the core layer 23. That is, the capping layer 27 is a protective layer for the core layer 23 and provides thermal stability by effectively dissipating heat generated in the core layer 23 to the outside. In addition, the capping layer 27 provides mechanical stability by supplementing the mechanical strength of the core layer 23. In addition, the capping layer 27 provides chemical durability by protecting the core layer 23 from hydrogen radicals and oxidation. In addition, the capping layer 27 protects the core layer 23 from outgassing generated during extreme ultraviolet lithography.

The material of the capping layer 27 may include $SiN_x$, SiC, $B_4C$, BN, or $MoSi_2$. In order not to damage the core layer 23 in a process of forming the capping layer 27, the capping layer 27 is formed in an ALD process instead of plasma. In order for the pellicle layer 20 to provide thermal stability, mechanical stability, and chemical durability while having an extreme ultraviolet transmittance of 85% or more in an extreme ultraviolet output environment of 350 W or more, the capping layer 27 may be formed to have a thickness of 10 nm or less.

As described above, according to the present disclosure, by forming the graphene defect healing layer 25 for covering the core layer 23 after forming graphene as the core layer 23, it is possible to heal defects of the graphene forming the core layer 23. Therefore, the pellicle 100 according to the present disclosure can provide thermal stability, mechanical stability, and chemical durability while having an extreme ultraviolet transmittance of 85% or more in an extreme ultraviolet output environment of 350 W or more.

Because the graphene defect healing layer 25 is formed in the ALD process using heat instead of plasma, defects occurring in the graphene can be healed without additional damage to the graphene forming the core layer 23.

In addition, because the ozone pre-treatment is performed through the ALD process using heat before the graphene defect healing layer 25 is formed, residues generated in the process of forming the graphene as the core layer 23 can be effectively removed.

In addition, because the capping layer 27 is formed on the graphene defect healing layer 25 in the ALD process, the core layer 23 can be protected from outgassing generated during extreme ultraviolet lithography.

Method for Manufacturing a Pellicle for Extreme Ultraviolet Lithography

Figure 2:
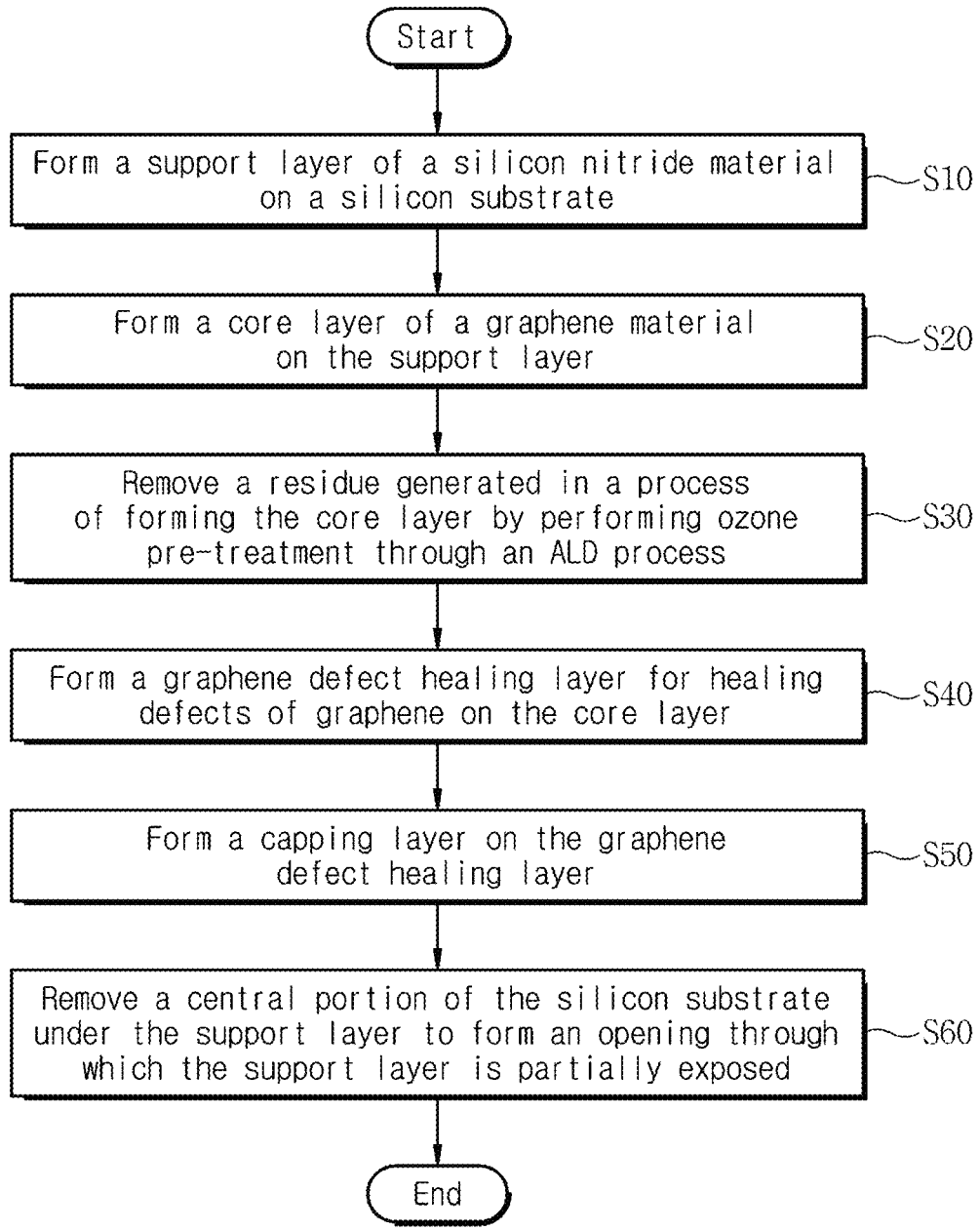
FIG. 2 is a flowchart showing a method for manufacturing a pellicle for extreme ultraviolet lithography having a graphene defect healing layer according to the present disclosure.

Hereinafter, a method for manufacturing the above-described pellicle 100 according to the present disclosure will be described with reference to FIG. 2. FIG. 2 is a flowchart showing a method for manufacturing a pellicle for extreme ultraviolet lithography having a graphene defect healing layer according to the present disclosure.

The pellicle manufacturing method according to the present disclosure includes a step S10 of forming a support layer of a silicon nitride material on a silicon substrate, a step S20 of forming a core layer of a graphene material on the support layer, a step S40 of forming a graphene defect healing layer for healing defects of graphene on the core layer, a step S50 of forming a capping layer on the graphene defect healing layer, and a step S60 of removing a central portion of the silicon substrate under the support layer to form an opening through which the support layer is partially exposed.

In addition, the pellicle manufacturing method according to the present disclosure may further include a step S30 of removing a residue generated in a process of forming the core layer by performing ozone pre-treatment through an ALD process. The step S30 may be performed between the step S20 of forming the core layer and the step S40 of forming the graphene defect healing layer.

Now, the respective steps of the pellicle manufacturing method according to the present disclosure will be described with reference to FIGS. 2 to 7. FIGS. 3 to 7 are views showing respective steps of the manufacturing method shown in FIG. 2.

Figure 3:
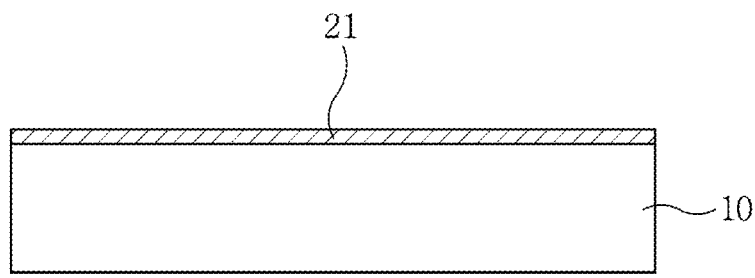
FIGS. 3 to 7 are views showing respective steps of the manufacturing method shown in FIG. 2.

First, at the step S10, as shown in FIG. 3, a support layer 21 made of a silicon nitride material is formed on a silicon substrate 10. Specifically, the support layer 21 is formed to a thickness of 10 nm or less in a low pressure chemical vapor deposition (LPCVD) process. The support layer 21 may be formed of $Si_3N_4$.

Figure 4:
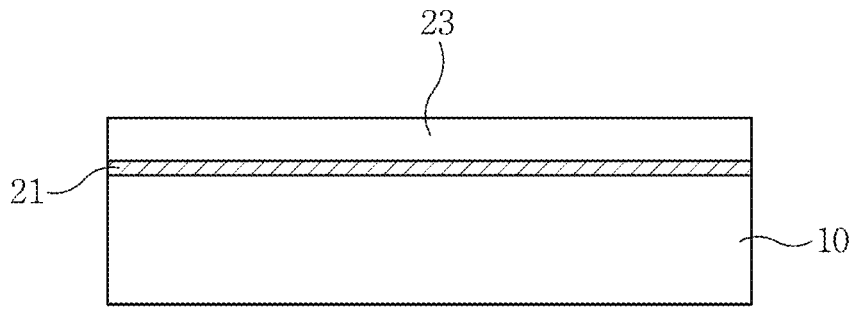

Next, at the step S20, as shown in FIG. 4, a core layer 23 made of a graphene material is formed on the support layer 21. Here, the graphene may be formed as a single layer or a multilayer by a direct growth method or a transfer method.

The transfer method is a method of growing graphene on a nickel thin film or a copper thin film in a CVD process and then transferring the grown graphene onto the support layer 21 to form the core layer 23.

The direct growth method is a method of directly growing the core layer 23 on the support layer 21. For example, after a few-layer graphene, a metal catalyst layer, and an amorphous carbon layer are sequentially formed on the support layer 21, heat treatment is performed. Then, carbon in the amorphous carbon layer is moved into the few-layer graphene by the interlayer exchange principle between the metal catalyst layer and the amorphous carbon layer, thereby directly growing multi-layer graphene to form the core layer 23.

Details of the direct growth method is as follows.

The few-layer graphene is formed on the support layer 21 by the transfer method.

The material of the metal catalyst layer may include Ni, Co, or Ru. The metal catalyst layer may be formed to a thickness of 10 nm to 100 nm in a sputtering process or an e-beam evaporation process.

The amorphous carbon layer may be formed to a thickness of 10 nm to 100 nm in the sputtering process.

Then, through heat treatment, a multi-layer graphene is directly grown from the few-layer graphene by interlayer exchange between the metal catalyst layer and the amorphous carbon layer.

As such, when heat treatment is performed using the few-layer graphene formed on the support layer 21 as a seed layer, the multi-layer graphene is directly grown be means of the interlayer exchange principle.

Thermodynamically, a driving force of the interlayer exchange is because the Gibbs free energy is lowered when the amorphous carbon becomes a crystalline state. Therefore, if the few-layer graphene acting as a seed layer is placed under the metal catalyst layer, the interlayer exchanges can occur wholly and smoothly even if the heat treatment is performed at a temperature lower than a conventional heat treatment temperature for growing the multi-layer graphene. For example, the heat treatment may be performed at 500 to 1000° C. for 30 minutes to 10 hours in a nitrogen and inert gas atmosphere.

As such, the multi-layer graphene can be grown directly on the support layer 21, so it is possible to simplify a process of manufacturing the multi-layer graphene forming the core layer 21 in manufacturing the pellicle 100.

In addition, because the few-layer graphene acts as a diffusion barrier that prevents metal of the metal catalyst layer from diffusing into the silicon substrate 10 through the support layer 21 during the heat treatment process, it is possible to improve the quality of the multi-layer graphene grown directly on the support layer 21.

Next, at the step S30, residues generated in the process of forming the core layer 23 are removed by ozone pre-treatment through an ALD process.

Figure 5:
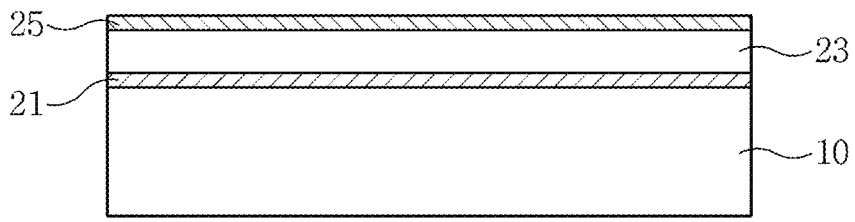

Next, at the step S40, as shown in FIG. 5, a graphene defect healing layer 25 for healing defects of the graphene is formed on the core layer 23. Specifically, the graphene defect healing layer 25 is selectively formed at a grain boundary of the core layer 23, thereby healing the defects of the graphene forming the core layer 23. The material of the graphene defect healing layer 25 may include Si, $SiO_2$, $Al_2O_3$, $TiO_2$, $ZrO_2$, $HfO_2$, $ZrSi_2$, $MoSi_2$, BN, Ru, Pt, or $MeO_xN_y$, (Me is one of Si, Al, Ti, Zr, and Hf, x+y=2). The graphene defect healing layer 25 may be formed to a thickness of 1 nm to 3 nm in the ALD process using heat.

Figure 6:
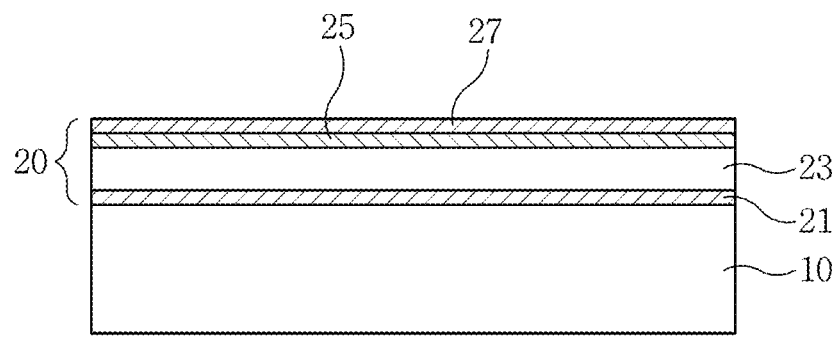

Subsequently, at the step S50, as shown in FIG. 6, a capping layer 27 is formed on the graphene defect healing layer 25, and as a result the pellicle layer 20 is formed on the silicon substrate 10. The material of the capping layer 27 may include $SiN_x$, SiC, $B_4C$, BN, or $MoSi_2$. The capping layer 27 may be formed to a thickness of 10 nm or less in the ALD process. For example, the capping layer 27 may be formed by depositing $Si_3N_4$ in the ALD process in which a nitrogen atmosphere is formed with nitrogen plasma. At this time, plasma-based deposition for forming the capping layer 27 may cause some damage to the graphene of the core layer 23. Nevertheless, because the graphene defect healing layer 25 covering the core layer 23 protects the core layer 23, it is possible to suppress damage to the graphene of the core layer 23.

Figure 7:
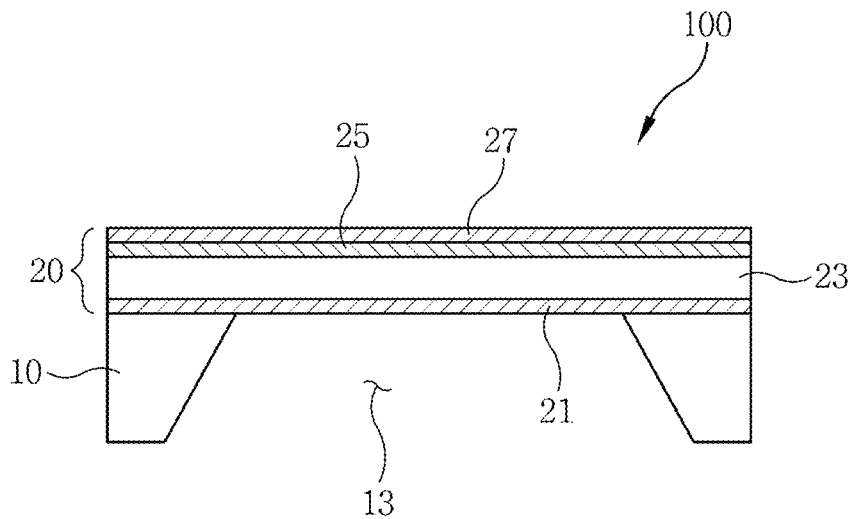

Thereafter, at the step S60, as shown in FIG. 7, the central portion of the silicon substrate 10 under the support layer 21 is removed to form an opening 13 through which the support layer 21 is partially exposed. As a result, the pellicle 100 according to the present disclosure is obtained. That is, the opening 13 is formed by removing the central portion of the silicon substrate 10 under the support layer 21 through a wet etching process. The opening 13 partially exposes the support layer 21 under the core layer 23.

EMBODIMENTS

In order to check the transmittance and reflectance of the pellicle according to the present disclosure in an extreme ultraviolet output environment of 350 W or more, a pellicle according to an embodiment was manufactured using the manufacturing method according to the present disclosure, and transmittance and reflectance were measured.

Figure 8:
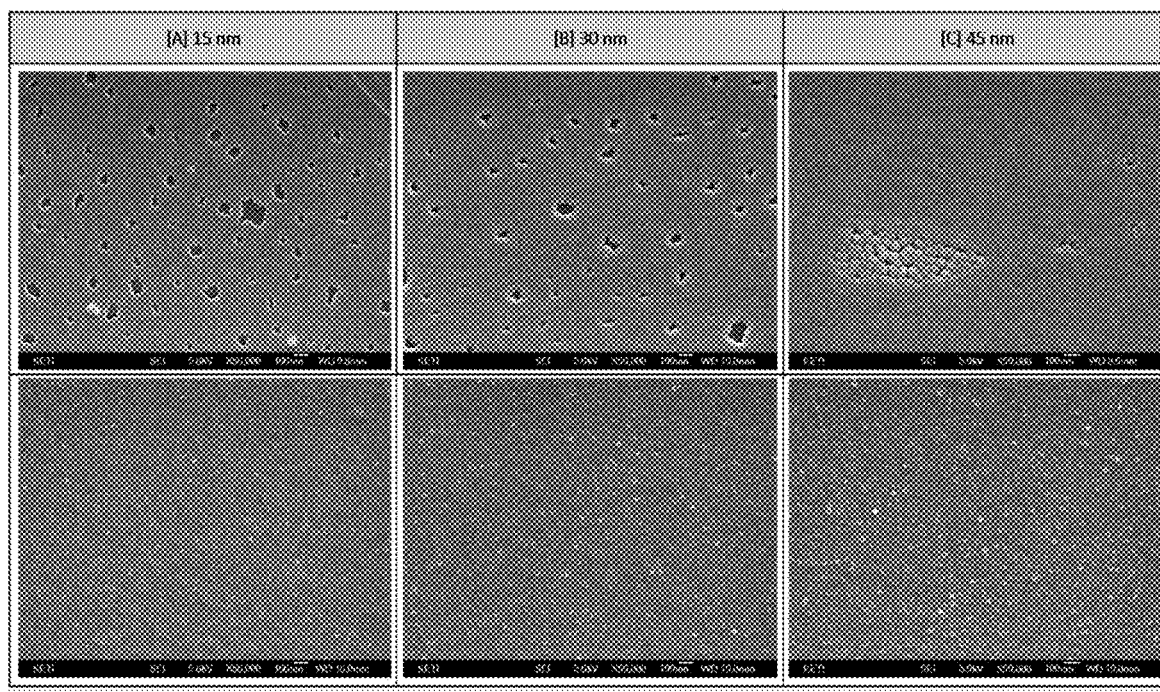
FIG. 8 is an SEM photograph of a graphene defect healing layer with or without ozone pre-treatment.

FIG. 8 is an SEM photograph of a graphene defect healing layer with or without ozone pre-treatment.

Referring to FIG. 8, a core layer was formed by growing graphene at 15 nm, 30 nm, or 45 nm on a support layer of $Si_3N_4$ formed on each of three silicon substrates.

In FIG. 8, the first row shows a state where a graphene defect healing layer is formed on the core layer without ozone pre-treatment. The material of the graphene defect healing layer is $SiO_2$. From the first row of FIG. 8, it can be seen that the graphene defect healing layer is not uniformly formed on the core layer.

In FIG. 8, the second row shows a state where a graphene defect healing layer is formed after ozone pre-treatment is performed through the ALD process. The material of the graphene defect healing layer is $SiO_2$. From the second row of FIG. 8, it can be seen that the graphene defect healing layer is uniformly formed on the core layer after ozone pre-treatment.

The pellicles according to first to third embodiments have a structure in which a support layer of $Si_3N_4$, a core layer of multi-layer graphene, a graphene defect healing layer of $SiO_2$, and a capping layer of $Si_3N_4$ are formed on a silicon substrate. The pellicles according to the first to third embodiments are expressed as $Si_3N_4\_SiO_2$ (Xnm)_C_$SiO_2$ (0 nm)_$Si_3N_4$. In this expression, Xnm denotes the thickness of the graphene defect healing layer, which is 1 nm in the first embodiment, 2 nm in the second embodiment, and 3 nm in the third embodiment. The thickness of the support layer is 5 nm.

While the thicknesses of the core layer and the capping layer were adjusted, the transmittance, reflectance, and maximum reflectance of each pellicle according to the first to third embodiments were simulated in an extreme ultraviolet output environment of 350 W.

Figure 9:
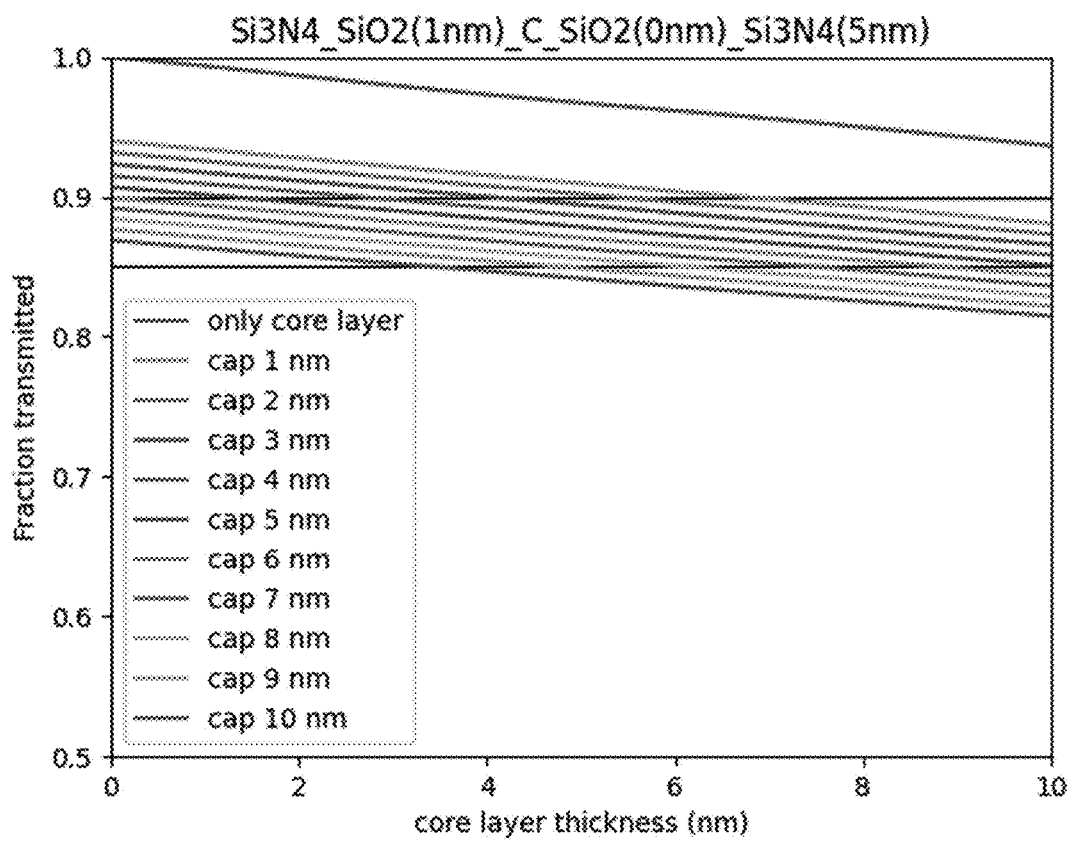
FIGS. 9 to 11 are graphs showing transmittance, reflectance, and maximum reflectance of a pellicle for lithography having a graphene defect healing layer formed of $SiO_2$ having a thickness of 1 nm according to a first embodiment.
Figure 10:
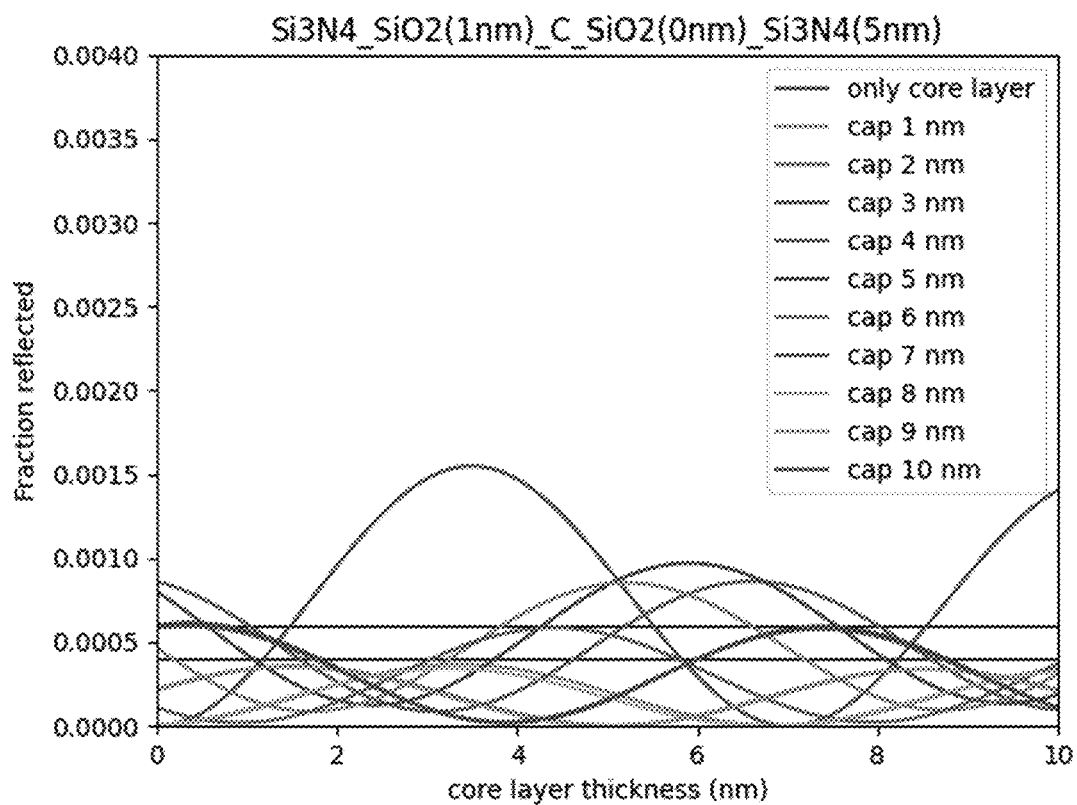
Figure 11:
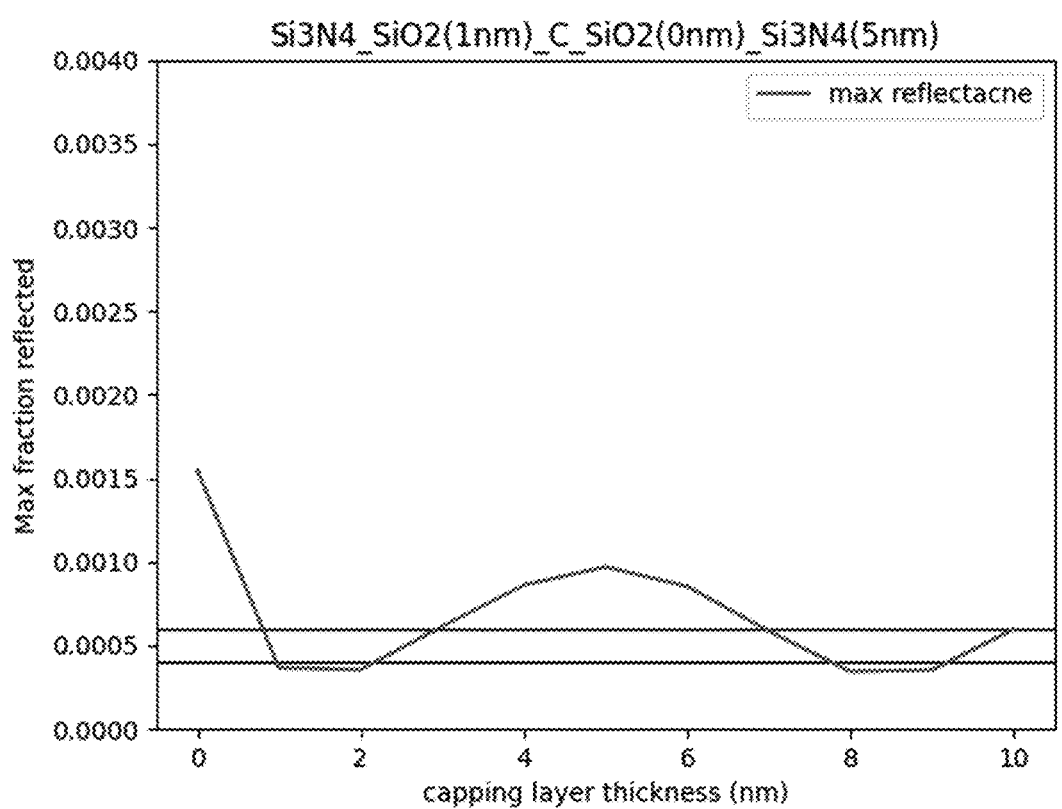

FIGS. 9 to 11 are graphs showing transmittance, reflectance, and maximum reflectance of a pellicle for lithography having a graphene defect healing layer formed of $SiO_2$ having a thickness of 1 nm according to a first embodiment.

Referring to FIGS. 9 to 11, the pellicle according to the first embodiment is expressed as $Si_3N_4\_SiO_2$ (1 nm)_C_$SiO_2$ (0 nm)_$Si_3N_4$ (5 nm).

According to the first embodiment, in case that the thickness of the graphene defect healing layer of $SiO_2$ is 1 nm, the extreme ultraviolet transmittance of 90% or more in an extreme ultraviolet output environment of 350 W or more can be seen when the thickness of the core layer is 7 nm or less and the thickness of the capping layer is 6 nm or less.

The pellicle according to the first embodiment has a reflectance of 0.0015% or less when the thickness of the core layer is 10 nm or less. In order for the maximum reflectance to be 0.0005%, the thickness of the capping layer needs to be maintained at 1 to 2 nm or 7 to 10 nm.

In the pellicle according to the first embodiment, the extreme ultraviolet transmittance of 90% or more in an extreme ultraviolet output environment of 350 W or more can be seen when the thickness of the support layer is 10 nm or less. Therefore, in the pellicle according to the first embodiment, the thickness of the support layer needs to be 10 nm or less.

Figure 12:
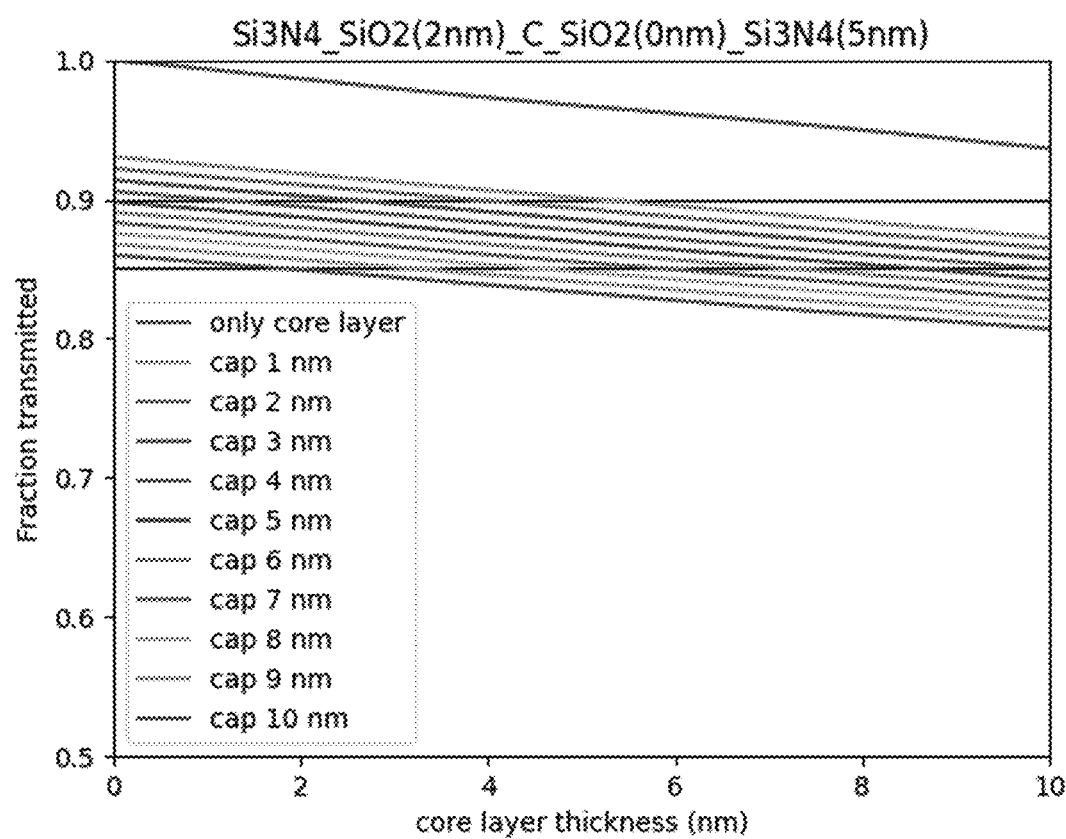
FIGS. 12 to 14 are graphs showing transmittance, reflectance, and maximum reflectance of a pellicle for lithography having a graphene defect healing layer formed of $SiO_2$ having a thickness of 2 nm according to a second embodiment.
Figure 13:
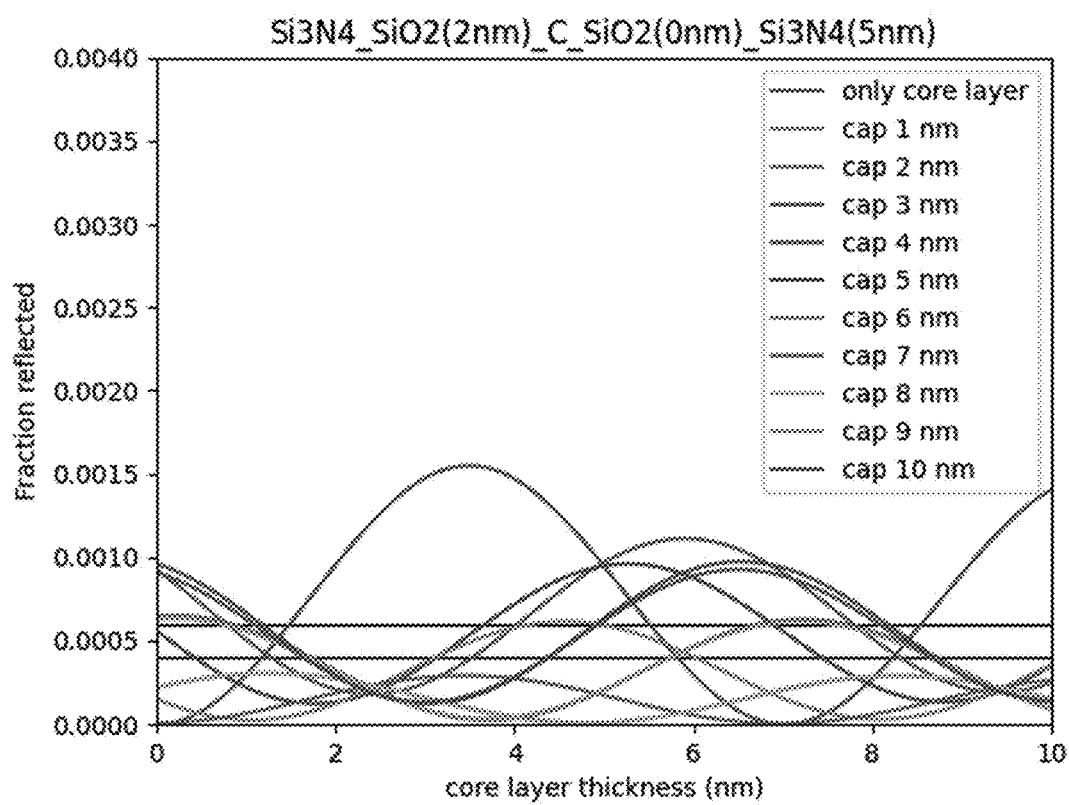
Figure 14:
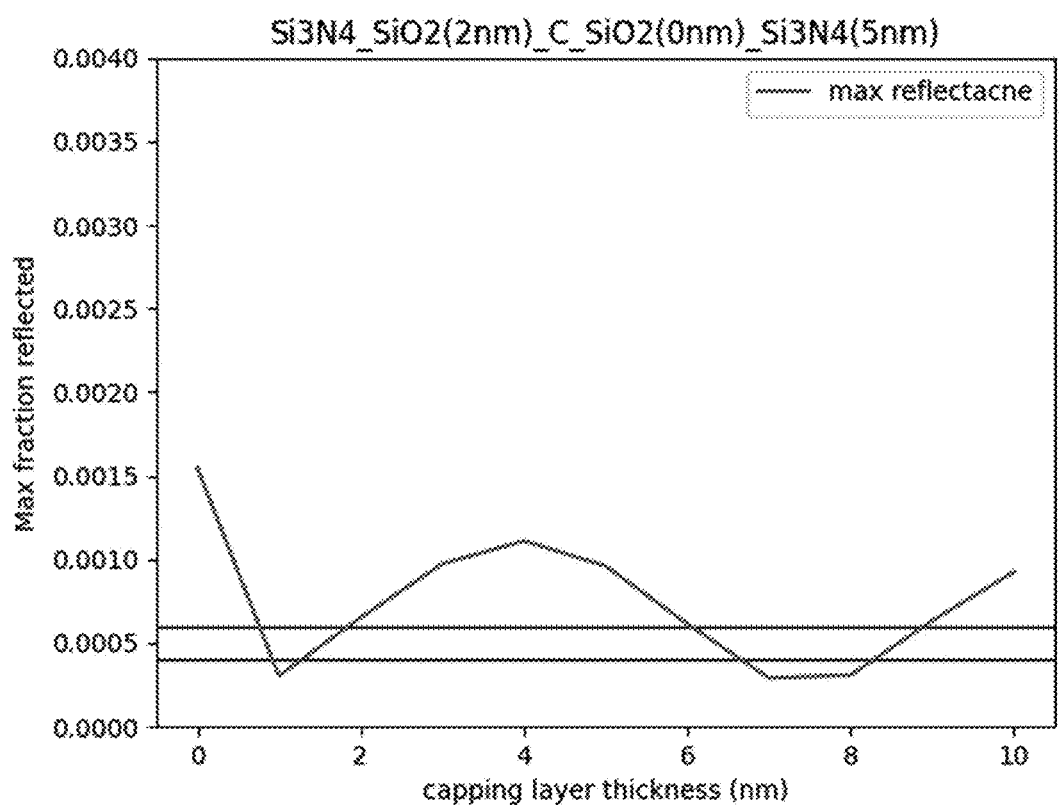

FIGS. 12 to 14 are graphs showing transmittance, reflectance, and maximum reflectance of a pellicle for lithography having a graphene defect healing layer formed of $SiO_2$ having a thickness of 2 nm according to a second embodiment.

Referring to FIGS. 12 to 14, the pellicle according to the second embodiment is expressed as $Si_3N_4\_SiO_2$ (2 nm)_C_$SiO_2$ (0 nm)_$Si_3N_4$ (5 nm).

According to the second embodiment, in case that the thickness of the graphene defect healing layer of $SiO_2$ is 2 nm, the extreme ultraviolet transmittance of 90% or more in an extreme ultraviolet output environment of 350 W or more can be seen when the thickness of the core layer is 5 nm or less and the thickness of the capping layer is 4 nm or less.

The pellicle according to the second embodiment has a reflectance of 0.0015% or less when the thickness of the core layer is 10 nm or less. In order for the maximum reflectance to be 0.0005%, the thickness of the capping layer needs to be maintained at about 1 nm or 7 to 9 nm.

In the pellicle according to the second embodiment, the extreme ultraviolet transmittance of 90% or more in an extreme ultraviolet output environment of 350 W or more can be seen when the thickness of the support layer is 10 nm or less. Therefore, in the pellicle according to the second embodiment, the thickness of the support layer needs to be 10 nm or less.

Figure 15:
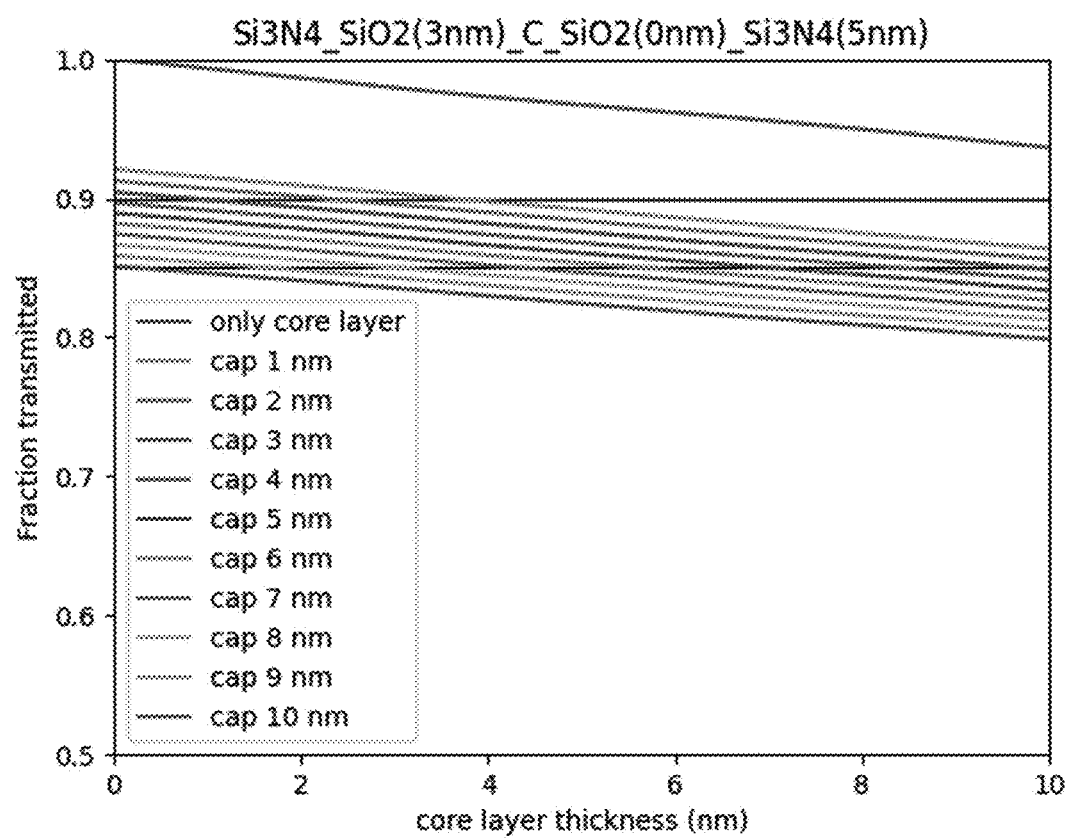
FIGS. 15 to 17 are graphs showing transmittance, reflectance, and maximum reflectance of a pellicle for lithography having a graphene defect healing layer formed of $SiO_2$ having a thickness of 3 nm according to a third embodiment.
Figure 16:
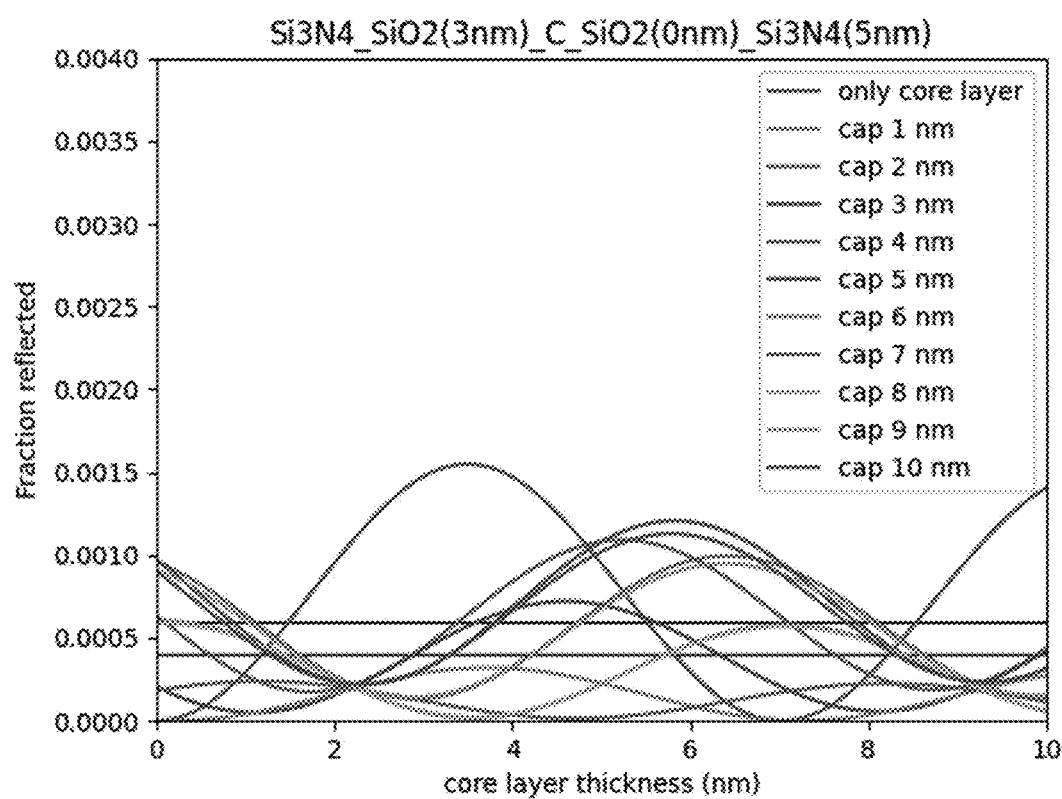
Figure 17:
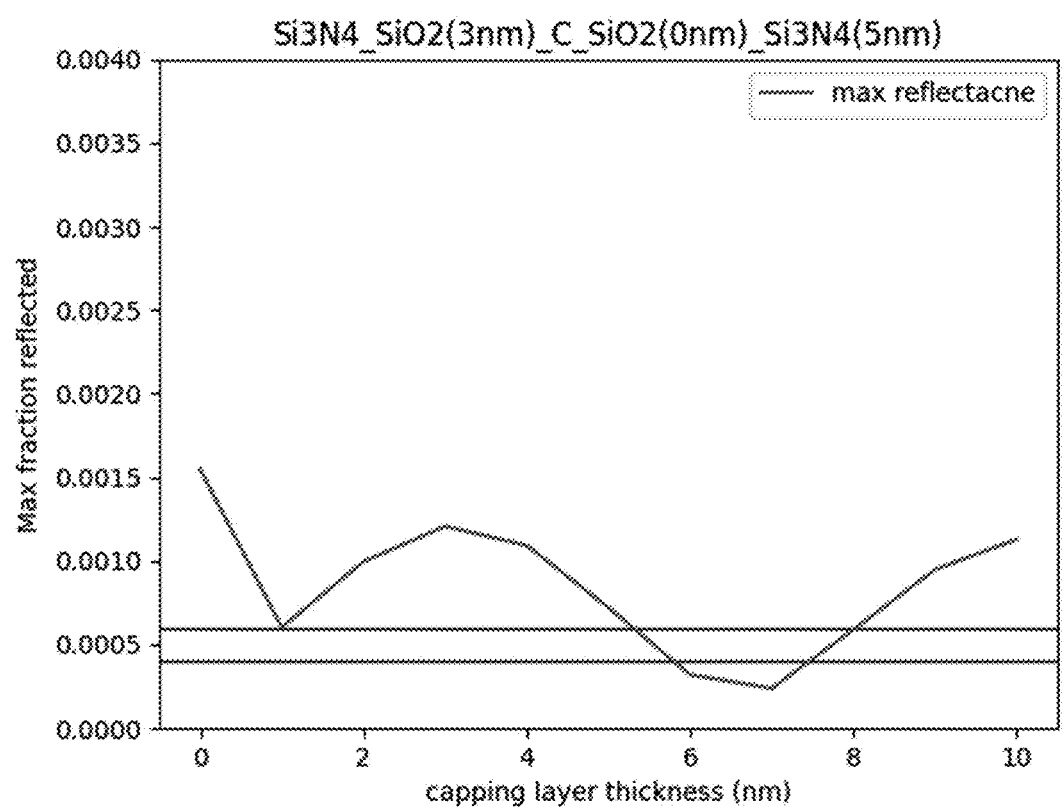

FIGS. 15 to 17 are graphs showing transmittance, reflectance, and maximum reflectance of a pellicle for lithography having a graphene defect healing layer formed of $SiO_2$ having a thickness of 3 nm according to a third embodiment.

Referring to FIGS. 15 to 17, the pellicle according to the third embodiment is expressed as $Si_3N_4\_SiO_2$ (3 nm)_C_$SiO_2$ (0 nm)_$Si_3N_4$ (5 nm).

According to the third embodiment, in case that the thickness of the graphene defect healing layer of $SiO_2$ is 3 nm, the extreme ultraviolet transmittance of 90% or more in an extreme ultraviolet output environment of 350 W or more can be seen when the thickness of the core layer is 4 nm or less and the thickness of the capping layer is 3 nm or less.

The pellicle according to the third embodiment has a reflectance of 0.0015% or less when the thickness of the core layer is 10 nm or less. In order for the maximum reflectance to be 0.0005%, the thickness of the capping layer needs to be maintained at 5 to 8 nm.

In the pellicle according to the third embodiment, the extreme ultraviolet transmittance of 90% or more in an extreme ultraviolet output environment of 350 W or more can be seen when the thickness of the support layer is 10 nm or less. Therefore, in the pellicle according to the third embodiment, the thickness of the support layer needs to be 10 nm or less.

The pellicles according to fourth to sixth embodiments have a structure in which a support layer of $Si_3N_4$, a core layer of multi-layer graphene, a graphene defect healing layer of BN, and a capping layer of $Si_3N_4$ are formed on a silicon substrate. The pellicles according to the fourth to sixth embodiments are expressed as $Si_3N_4\_BN$ (Xnm)_C_$SiO_2$ (0 nm)_$Si_3N_4$. In this expression, Xnm denotes the thickness of the graphene defect healing layer, which is 1 nm in the fourth embodiment, 2 nm in the fifth embodiment, and 3 nm in the sixth embodiment. The thickness of the support layer is 5 nm.

While the thicknesses of the core layer and the capping layer were adjusted, the transmittance, reflectance, and maximum reflectance of each pellicle according to the fourth to sixth embodiments were simulated in an extreme ultraviolet output environment of 350 W.

Figure 18:
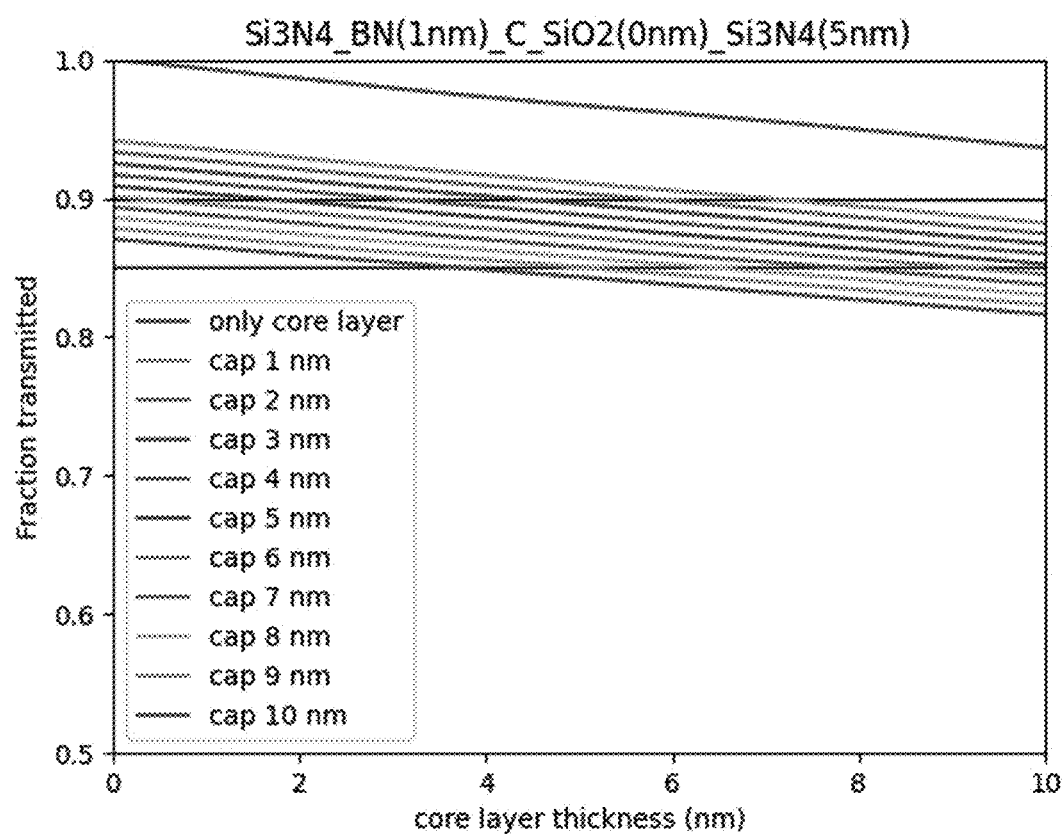
FIGS. 18 to 20 are graphs showing transmittance, reflectance, and maximum reflectance of a pellicle for lithography having a graphene defect healing layer formed of BN having a thickness of 1 nm according to a fourth embodiment.
Figure 19:
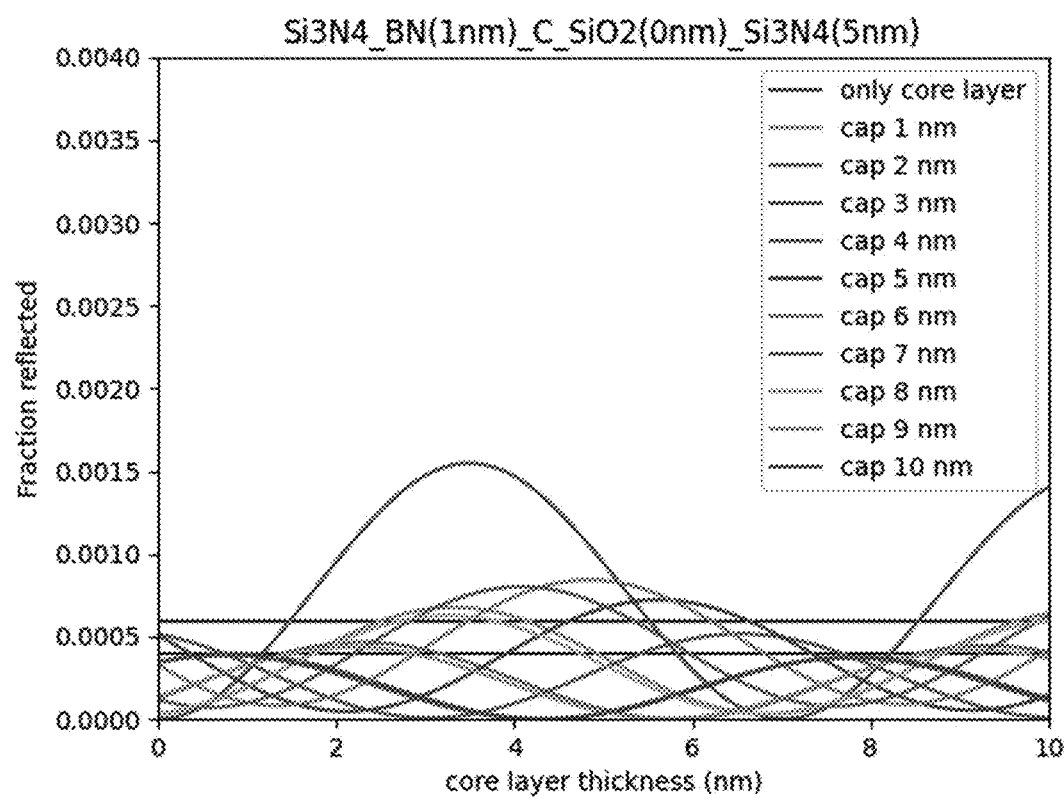
Figure 20:
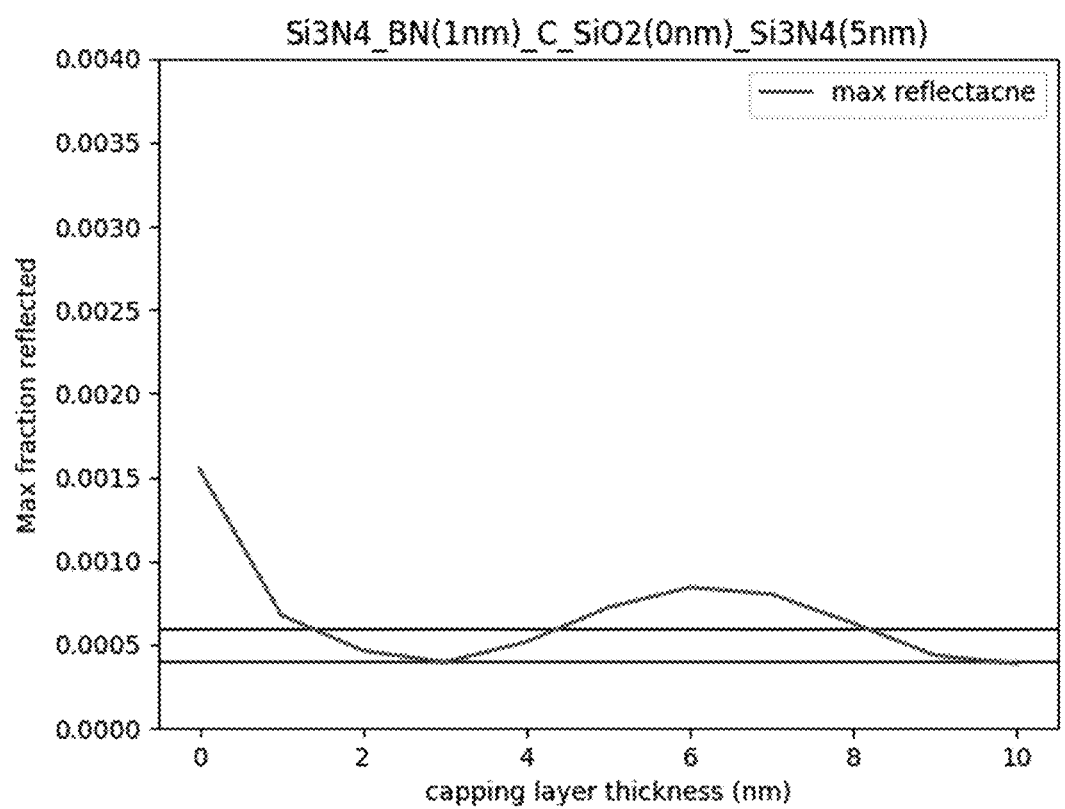

FIGS. 18 to 20 are graphs showing transmittance, reflectance, and maximum reflectance of a pellicle for lithography having a graphene defect healing layer formed of BN having a thickness of 1 nm according to a fourth embodiment.

Referring to FIGS. 18 to 20, the pellicle according to the fourth embodiment is expressed as $Si_3N_4\_BN$ (1 nm)_C_$SiO_2$ (0 nm)_$Si_3N_4$ (5 nm).

According to the fourth embodiment, in case that the thickness of the graphene defect healing layer of BN is 1 nm, the extreme ultraviolet transmittance of 90% or more in an extreme ultraviolet output environment of 350 W or more can be seen when the thickness of the core layer is 8 nm or less and the thickness of the capping layer is 6 nm or less.

The pellicle according to the fourth embodiment has a reflectance of 0.0015% or less when the thickness of the core layer is 10 nm or less. In order for the maximum reflectance to be 0.0005%, the thickness of the capping layer needs to be maintained at 2 to 4 nm or 8 to 10 nm.

In the pellicle according to the fourth embodiment, the extreme ultraviolet transmittance of 90% or more in an extreme ultraviolet output environment of 350 W or more can be seen when the thickness of the support layer is 10 nm or less. Therefore, in the pellicle according to the fourth embodiment, the thickness of the support layer needs to be 10 nm or less.

Figure 21:
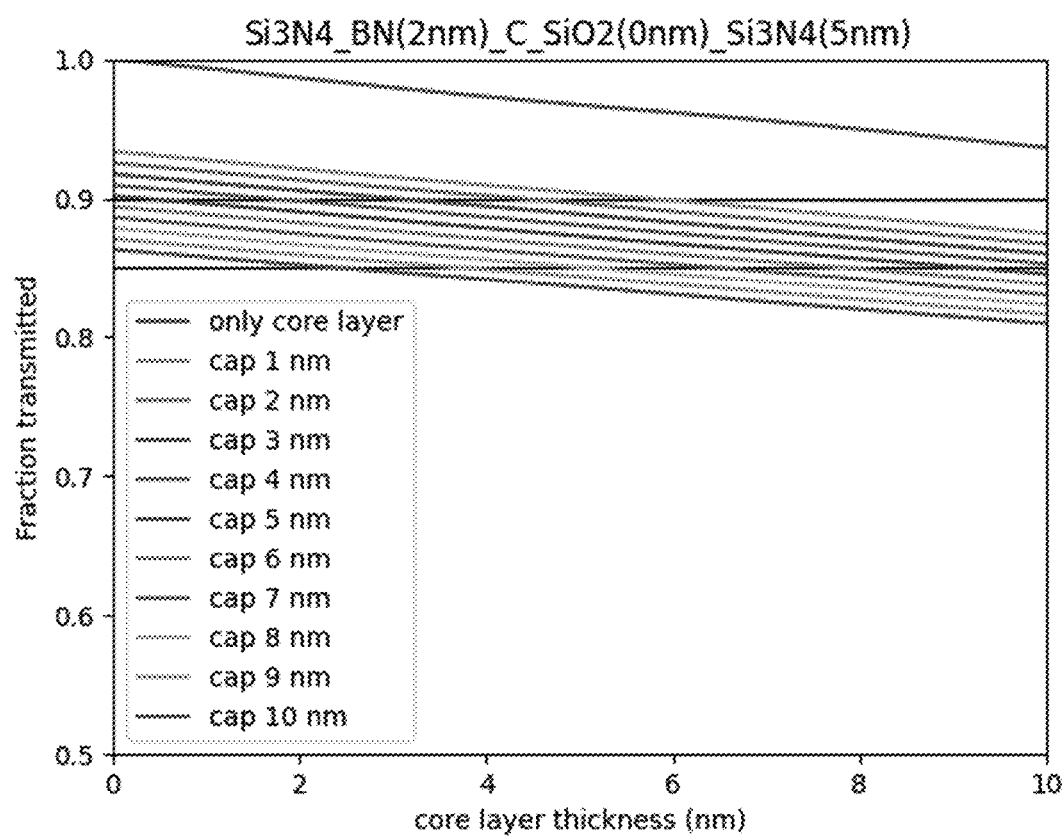
FIGS. 21 to 23 are graphs showing transmittance, reflectance, and maximum reflectance of a pellicle for lithography having a graphene defect healing layer formed of BN having a thickness of 2 nm according to a fifth embodiment.
Figure 22:
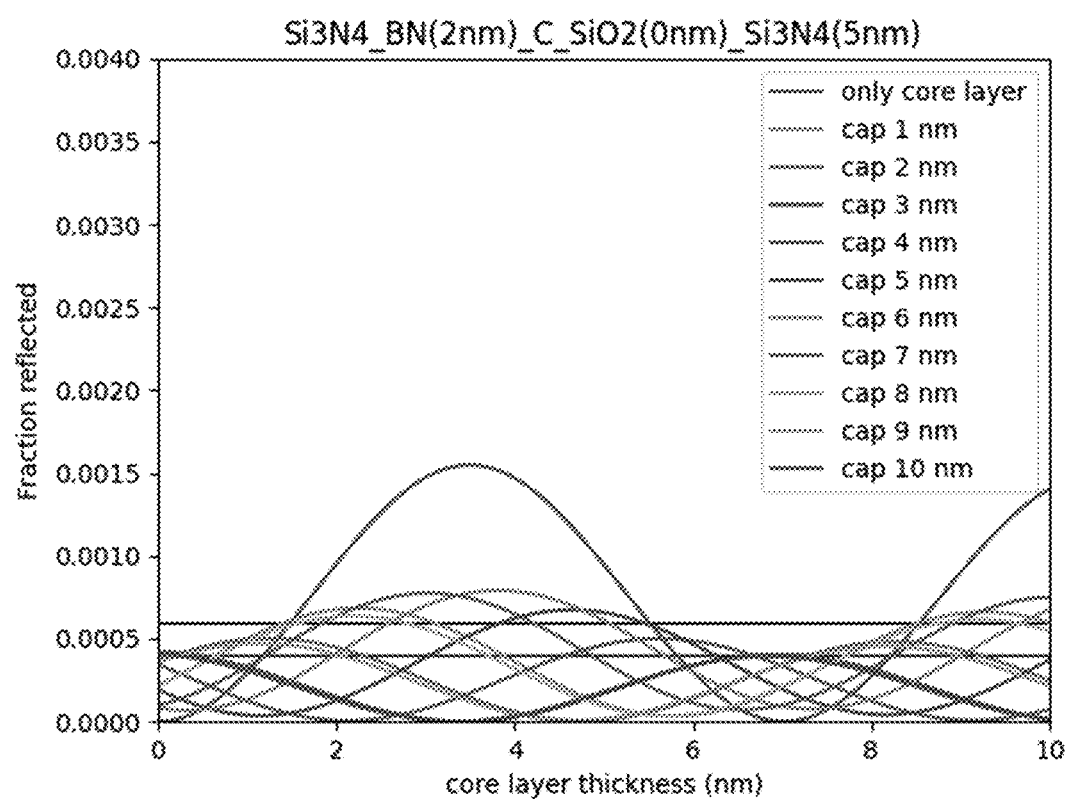
Figure 23:
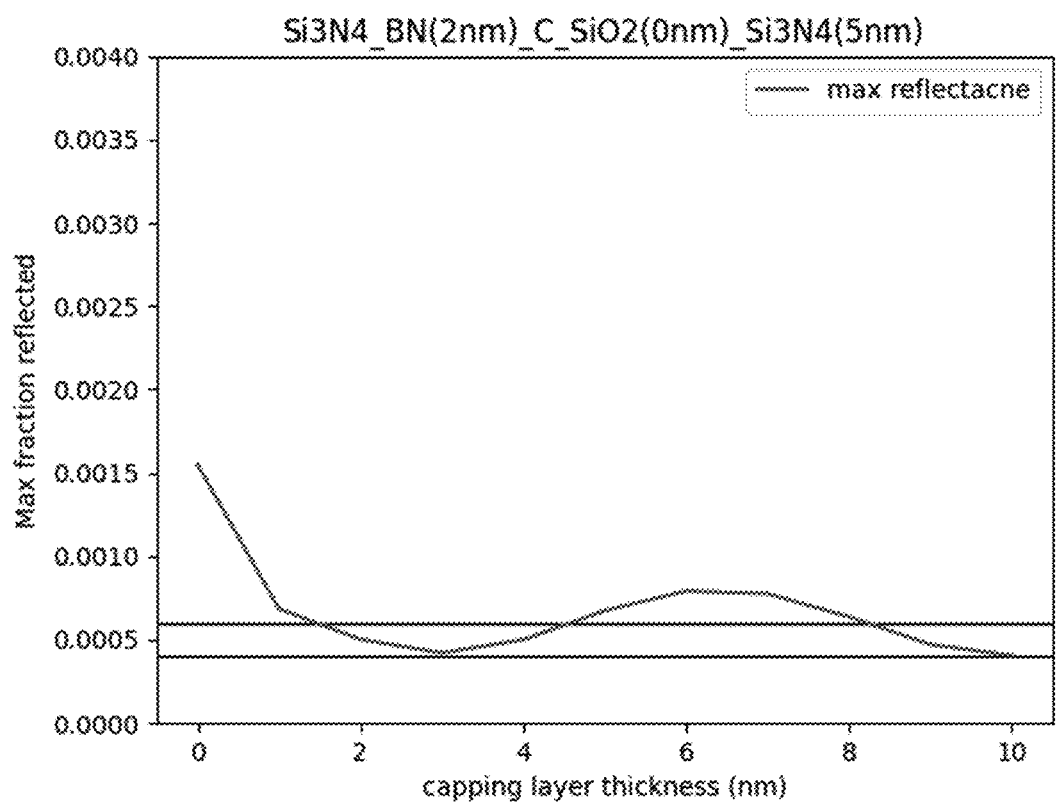

FIGS. 21 to 23 are graphs showing transmittance, reflectance, and maximum reflectance of a pellicle for lithography having a graphene defect healing layer formed of BN having a thickness of 2 nm according to a fifth embodiment.

Referring to FIGS. 21 to 23, the pellicle according to the fifth embodiment is expressed as $Si_3N_4\_BN$ (2 nm)_C_$SiO_2$ (0 nm)_$Si_3N_4$ (5 nm).

According to the fifth embodiment, in case that the thickness of the graphene defect healing layer of BN is 2 nm, the extreme ultraviolet transmittance of 90% or more in an extreme ultraviolet output environment of 350 W or more can be seen when the thickness of the core layer is 6 nm or less and the thickness of the capping layer is 4 nm or less.

The pellicle according to the fifth embodiment has a reflectance of 0.0015% or less when the thickness of the core layer is 10 nm or less. In order for the maximum reflectance to be 0.0005%, the thickness of the capping layer needs to be maintained at 2 to 4 nm or 8 to 10 nm.

In the pellicle according to the fifth embodiment, the extreme ultraviolet transmittance of 90% or more in an extreme ultraviolet output environment of 350 W or more can be seen when the thickness of the support layer is 10 nm or less. Therefore, in the pellicle according to the fifth embodiment, the thickness of the support layer needs to be 10 nm or less.

Figure 24:
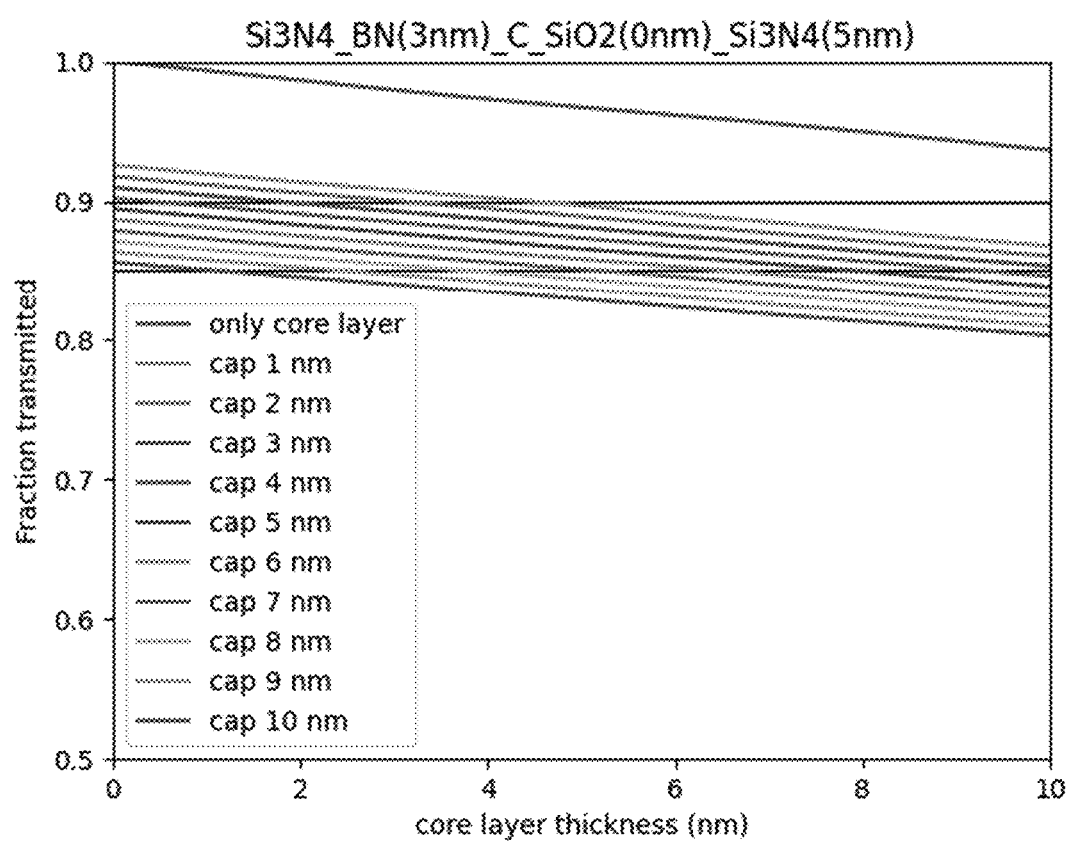
FIGS. 24 to 26 are graphs showing transmittance, reflectance, and maximum reflectance of a pellicle for lithography having a graphene defect healing layer formed of BN having a thickness of 3 nm according to a sixth embodiment.
Figure 25:
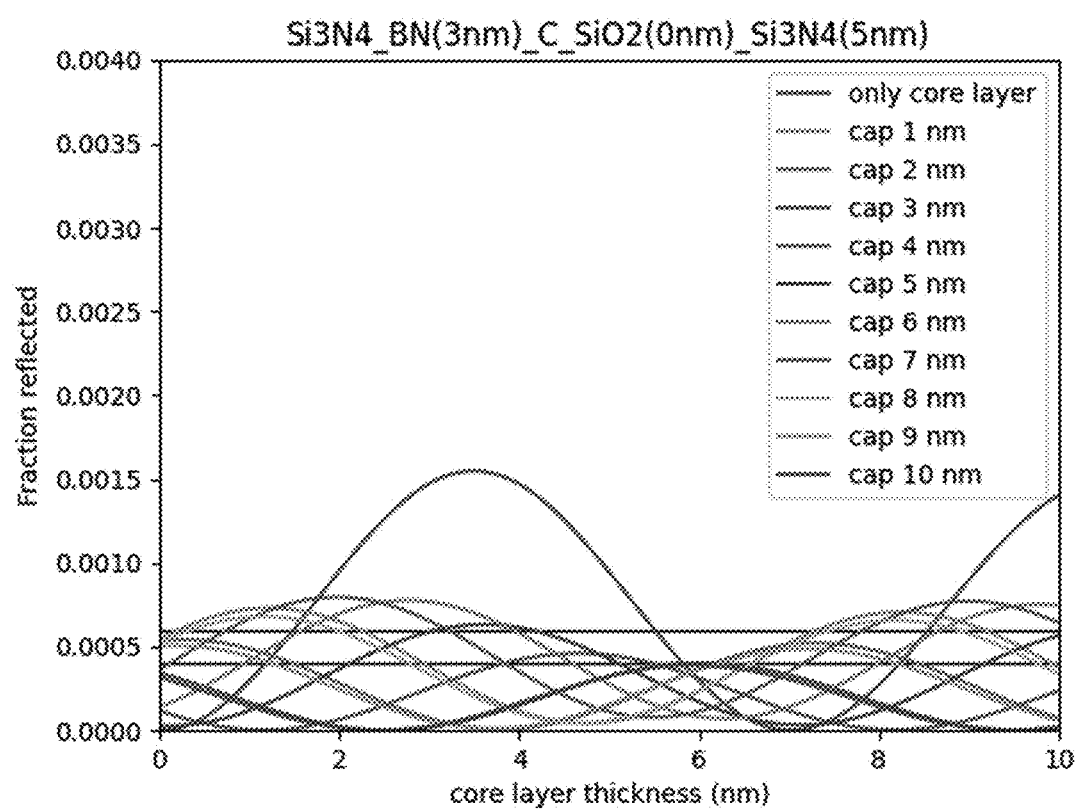
Figure 26:
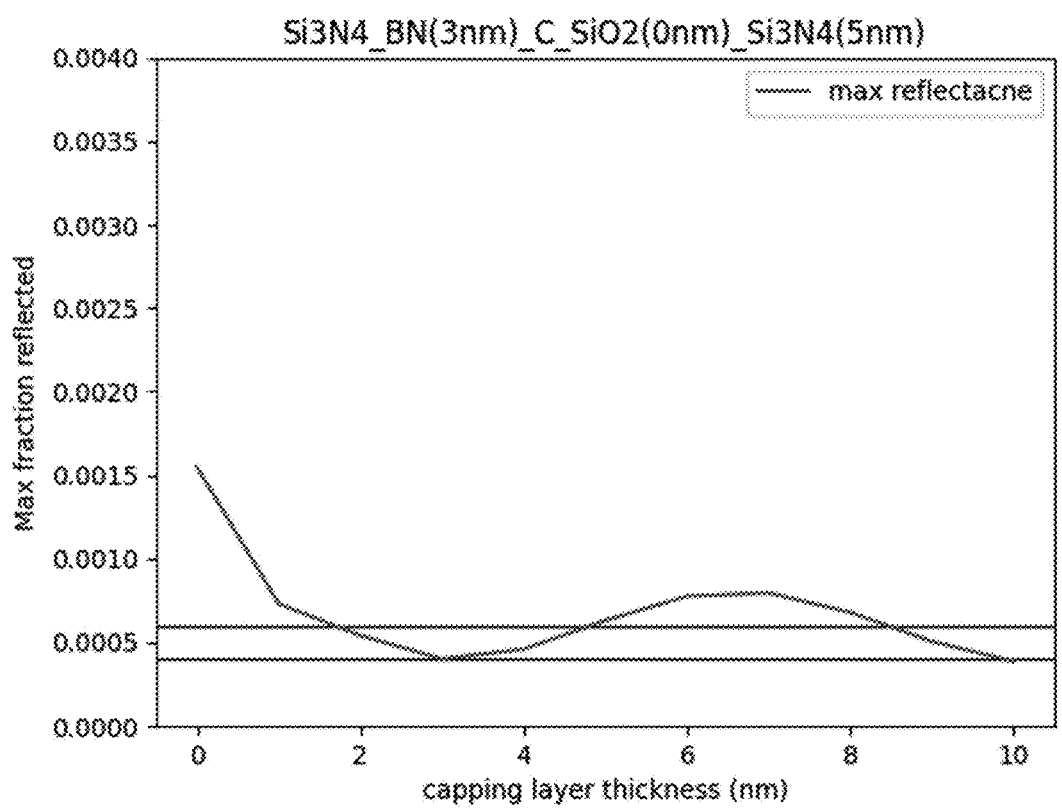

FIGS. 24 to 26 are graphs showing transmittance, reflectance, and maximum reflectance of a pellicle for lithography having a graphene defect healing layer formed of BN having a thickness of 3 nm according to a sixth embodiment.

Referring to FIGS. 24 to 26, the pellicle according to the sixth embodiment is expressed as $Si_3N_4\_BN$ (3 nm)_C_$SiO_2$ (0 nm)_$Si_3N_4$ (5 nm).

According to the sixth embodiment, in case that the thickness of the graphene defect healing layer of BN is 3 nm, the extreme ultraviolet transmittance of 90% or more in an extreme ultraviolet output environment of 350 W or more can be seen when the thickness of the core layer is 5 nm or less and the thickness of the capping layer is 4 nm or less.

The pellicle according to the sixth embodiment has a reflectance of 0.0015% or less when the thickness of the core layer is 10 nm or less. In order for the maximum reflectance to be 0.0005%, the thickness of the capping layer needs to be maintained at 2 to 4 nm or 9 to 10 nm.

In the pellicle according to the sixth embodiment, the extreme ultraviolet transmittance of 90% or more in an extreme ultraviolet output environment of 350 W or more can be seen when the thickness of the support layer is 10 nm or less. Therefore, in the pellicle according to the sixth embodiment, the thickness of the support layer needs to be 10 nm or less.

Meanwhile, although the pellicles according to the first to sixth embodiments include the support layer formed to have a thickness of 5 nm, this is exemplary only and not construed as a limitation. Alternatively, as shown in FIGS. 27 to 38, the support layer may be formed to have a thickness of 10 nm, for example.

Figure 27:
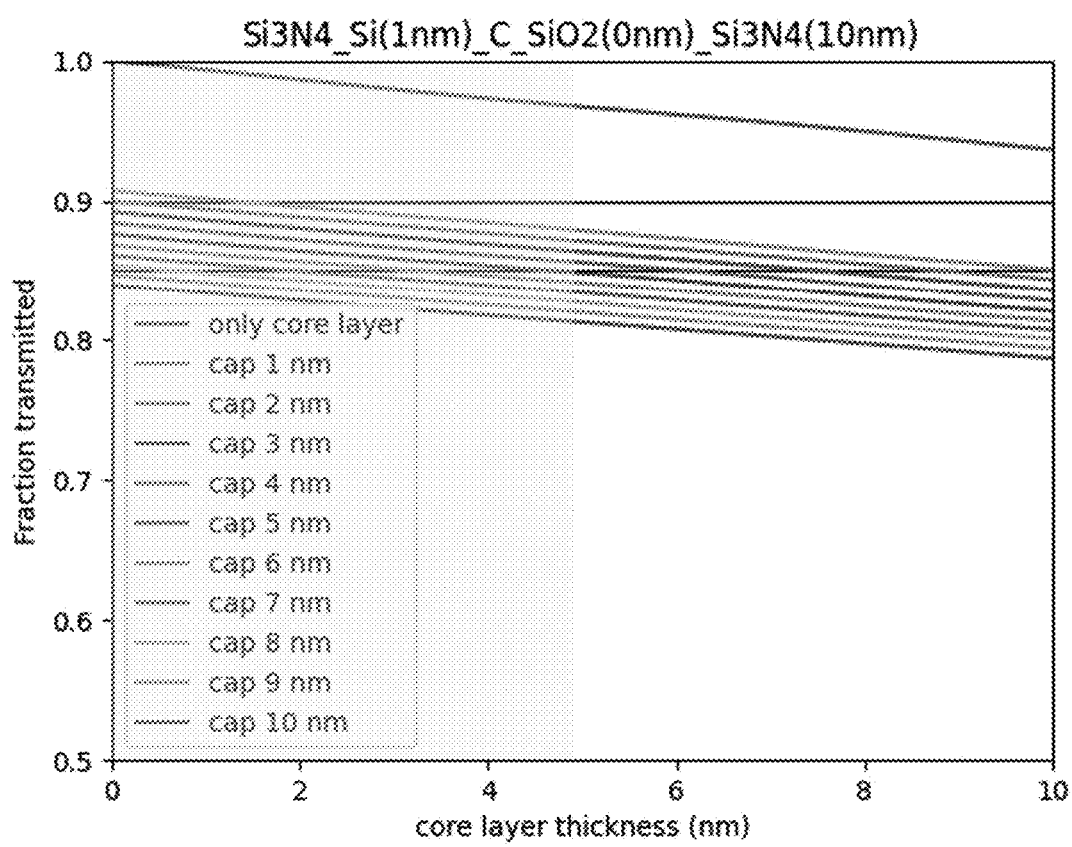
FIGS. 27 to 29 are graphs showing transmittance, reflectance, and maximum reflectance of a pellicle for lithography having a graphene defect healing layer formed of Si having a thickness of 1 nm according to a seventh embodiment.
Figure 28:
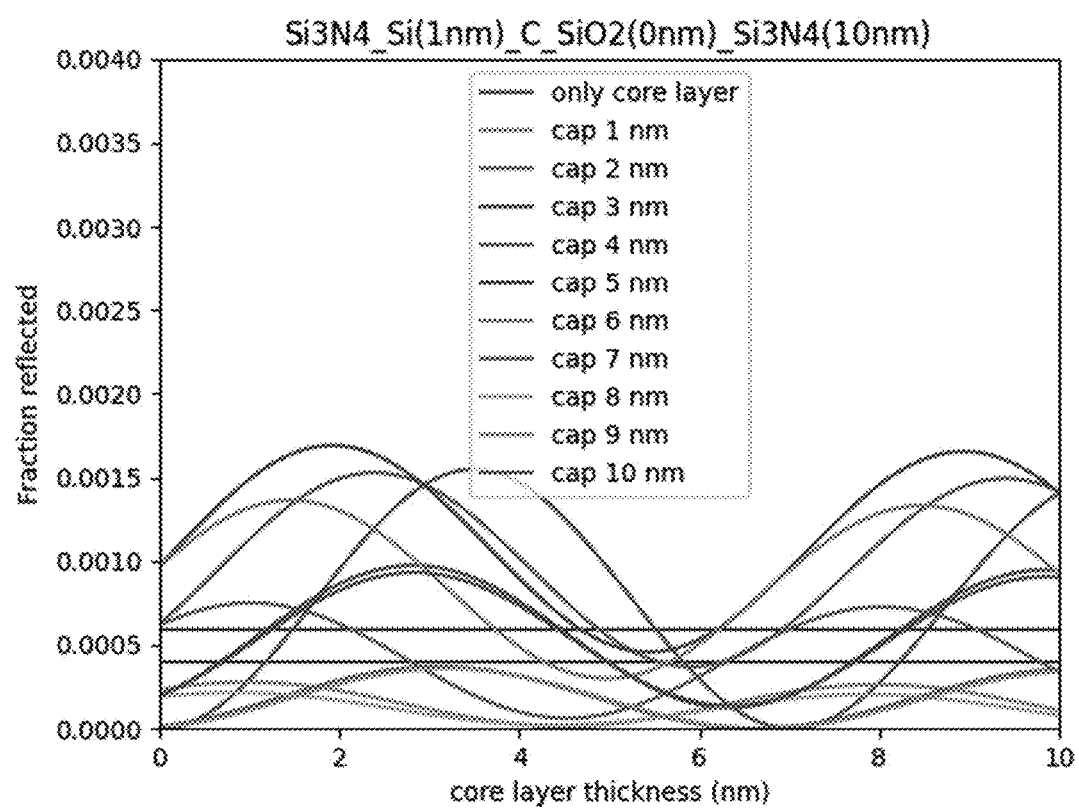
Figure 29:
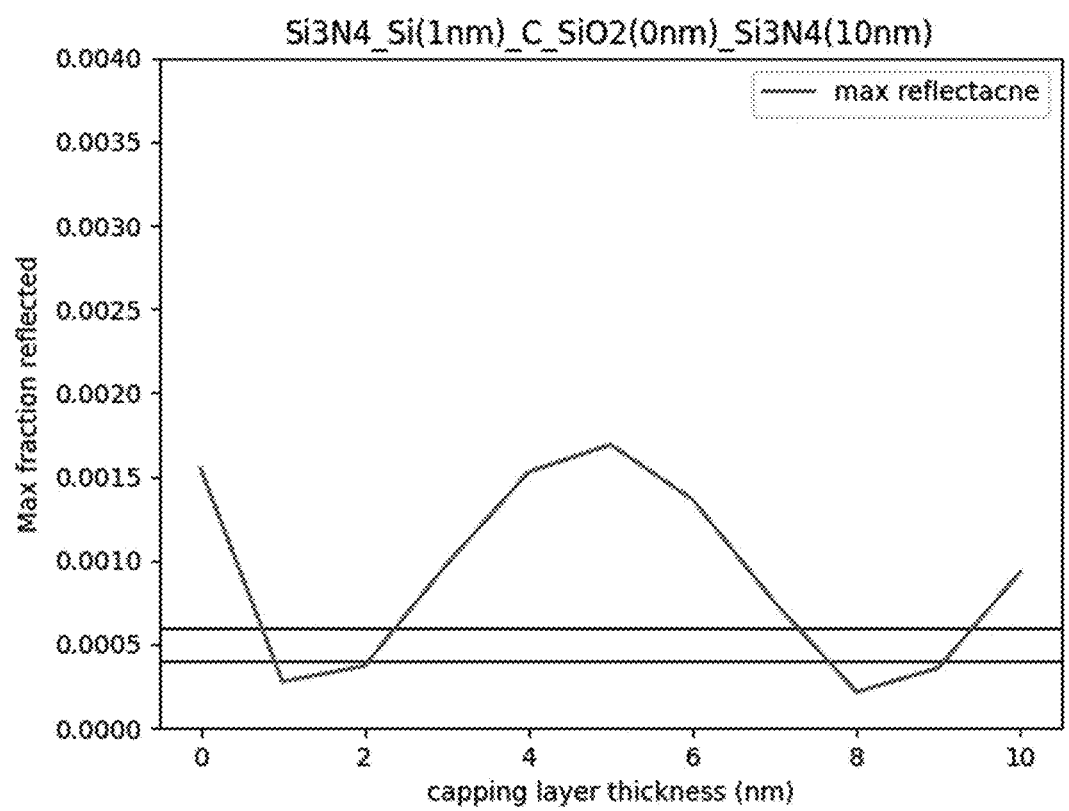

FIGS. 27 to 29 are graphs showing transmittance, reflectance, and maximum reflectance of a pellicle for lithography having a graphene defect healing layer formed of Si having a thickness of 1 nm according to a seventh embodiment.

Referring to FIGS. 27 to 29, the pellicle according to the seventh embodiment is expressed as $Si_3N_4\_Si$ (1 nm)_C_$SiO_2$ (0 nm)_$Si_3N_4$ (10 nm).

According to the seventh embodiment, in case that the thickness of the graphene defect healing layer of Si is 1 nm, the extreme ultraviolet transmittance of 85% or more in an extreme ultraviolet output environment of 350 W or more can be seen when the thickness of the core layer is 5 nm or less.

The pellicle according to the seventh embodiment has a reflectance of 0.0020% or less when the thickness of the core layer is 10 nm or less. In order for the maximum reflectance to be 0.0005%, the thickness of the capping layer needs to be maintained at 1 to 2 nm or 7 to 9 nm.

Figure 30:
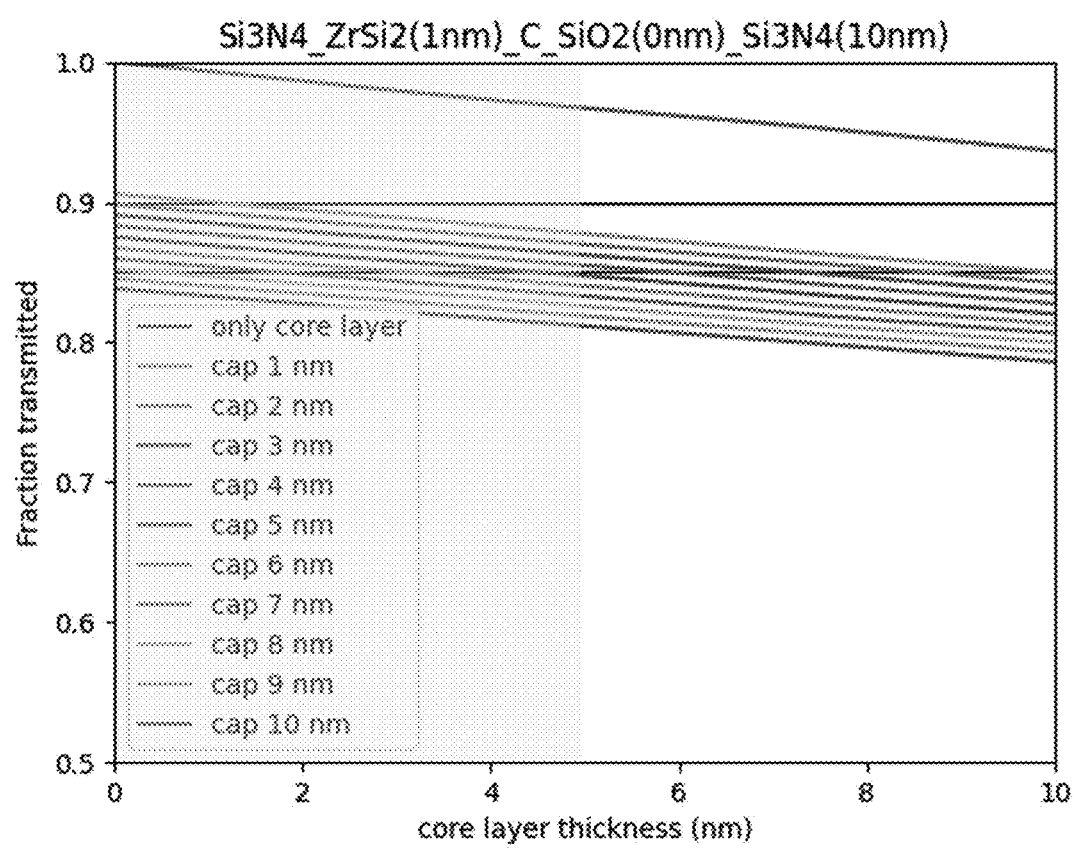
FIGS. 30 to 32 are graphs showing transmittance, reflectance, and maximum reflectance of a pellicle for lithography having a graphene defect healing layer formed of $ZrSi_2$ having a thickness of 1 nm according to an eighth embodiment.
Figure 31:
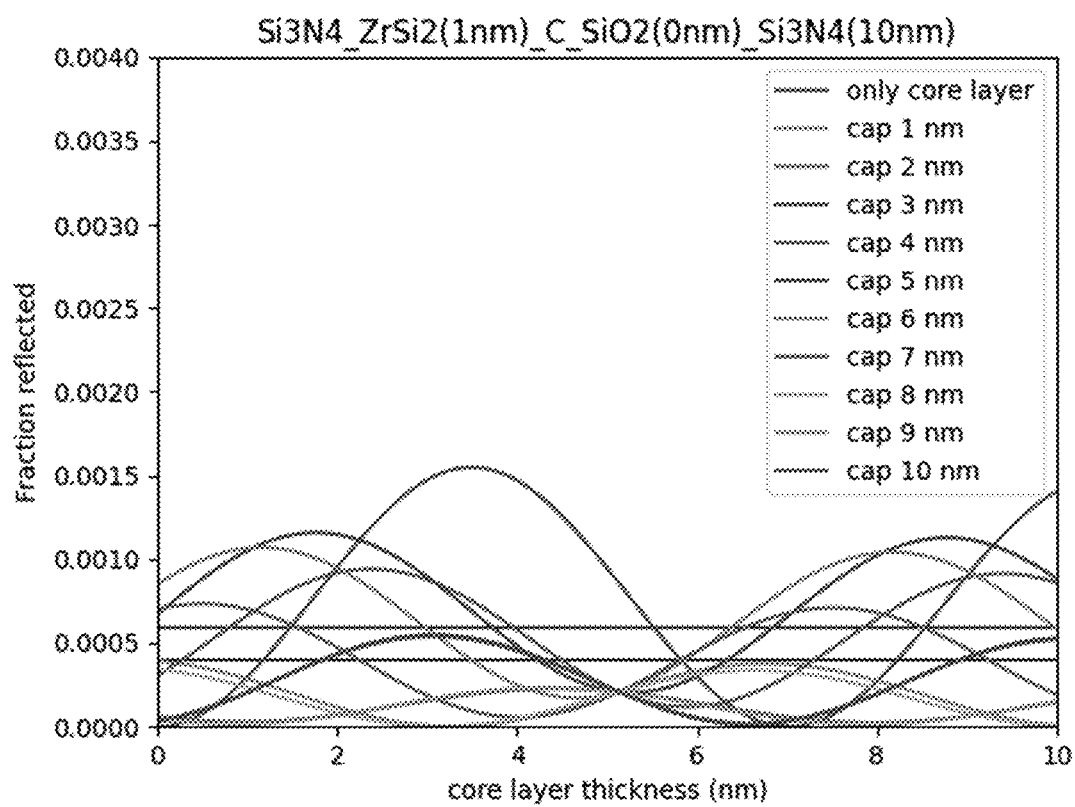
Figure 32:
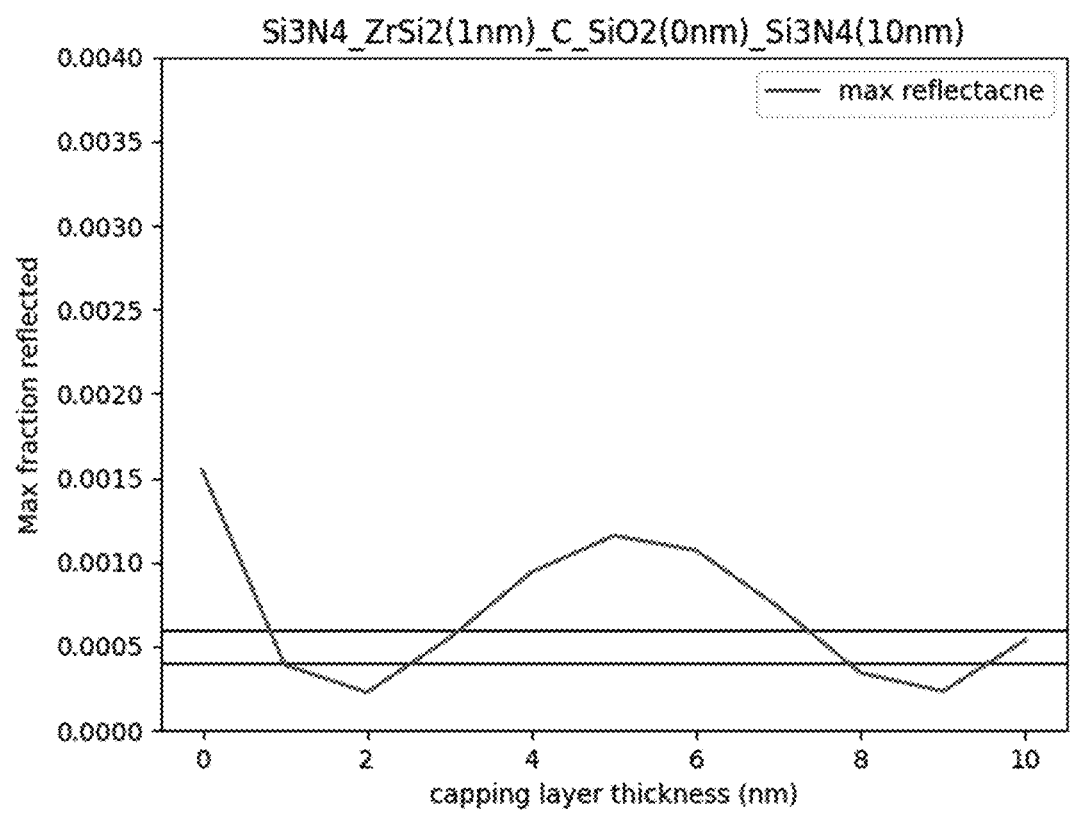

FIGS. 30 to 32 are graphs showing transmittance, reflectance, and maximum reflectance of a pellicle for lithography having a graphene defect healing layer formed of $ZrSi_2$ having a thickness of 1 nm according to an eighth embodiment.

Referring to FIGS. 30 to 32, the pellicle according to the eighth embodiment is expressed as $Si_3N_4\_ZrSi_2$ (1 nm)_C_$SiO_2$ (0 nm)_$Si_3N_4$ (10 nm).

According to the eighth embodiment, in case that the thickness of the graphene defect healing layer of $ZrSi_2$ is 1 nm, the extreme ultraviolet transmittance of 85% or more in an extreme ultraviolet output environment of 350 W or more can be seen when the thickness of the core layer is 5 nm or less.

The pellicle according to the eighth embodiment has a reflectance of 0.0020% or less when the thickness of the core layer is 10 nm or less. In order for the maximum reflectance to be 0.0005%, the thickness of the capping layer needs to be maintained at 1 to 3 nm or 7 to 9 nm.

Figure 33:
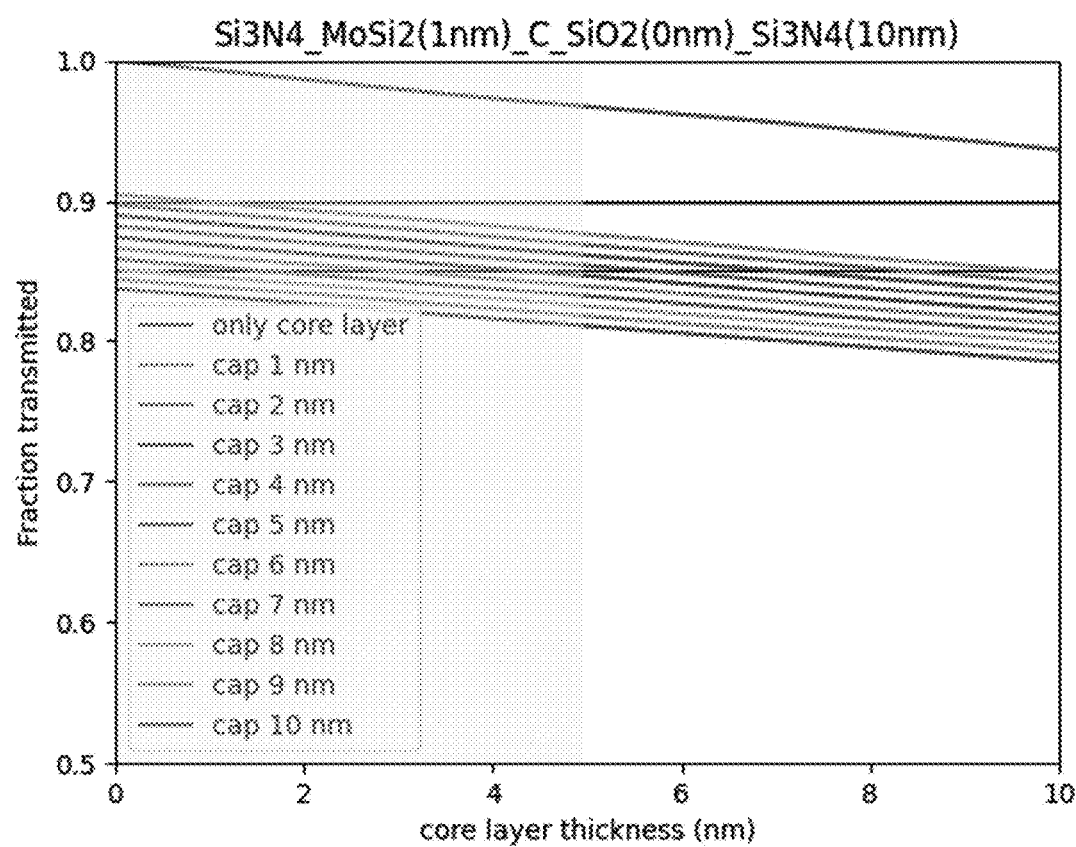
FIGS. 33 to 35 are graphs showing transmittance, reflectance, and maximum reflectance of a pellicle for lithography having a graphene defect healing layer formed of $MoSi_2$ having a thickness of 1 nm according to a ninth embodiment.
Figure 34:
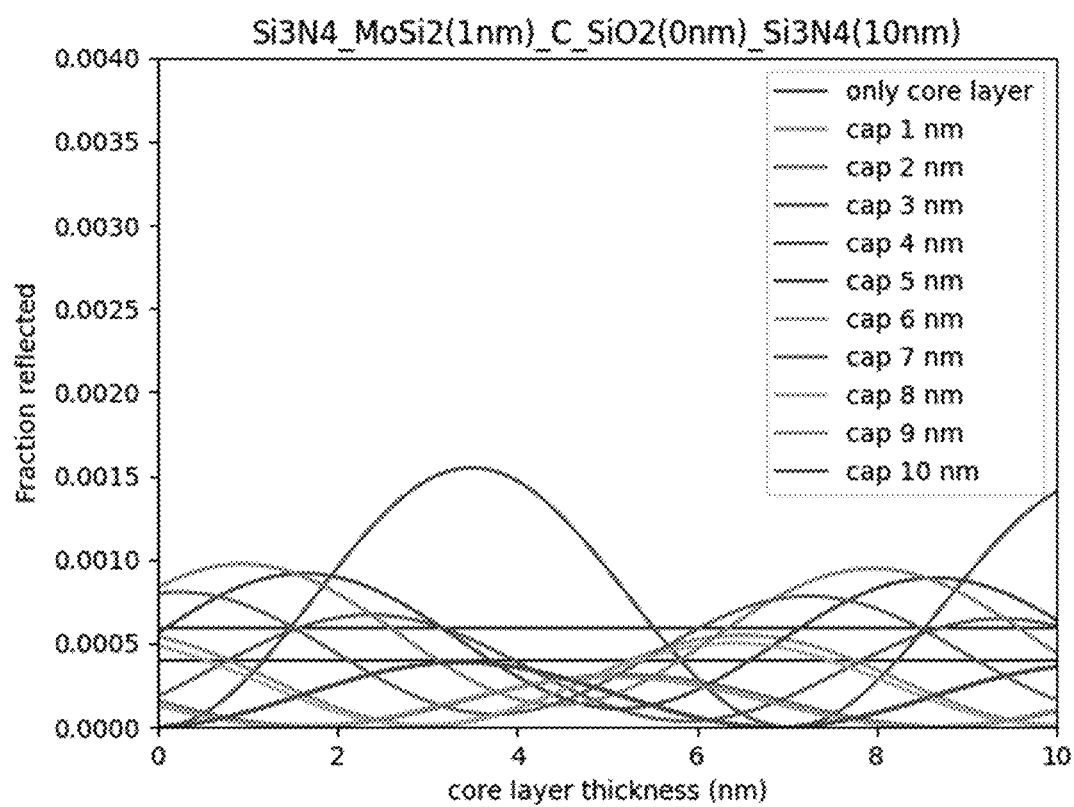
Figure 35:
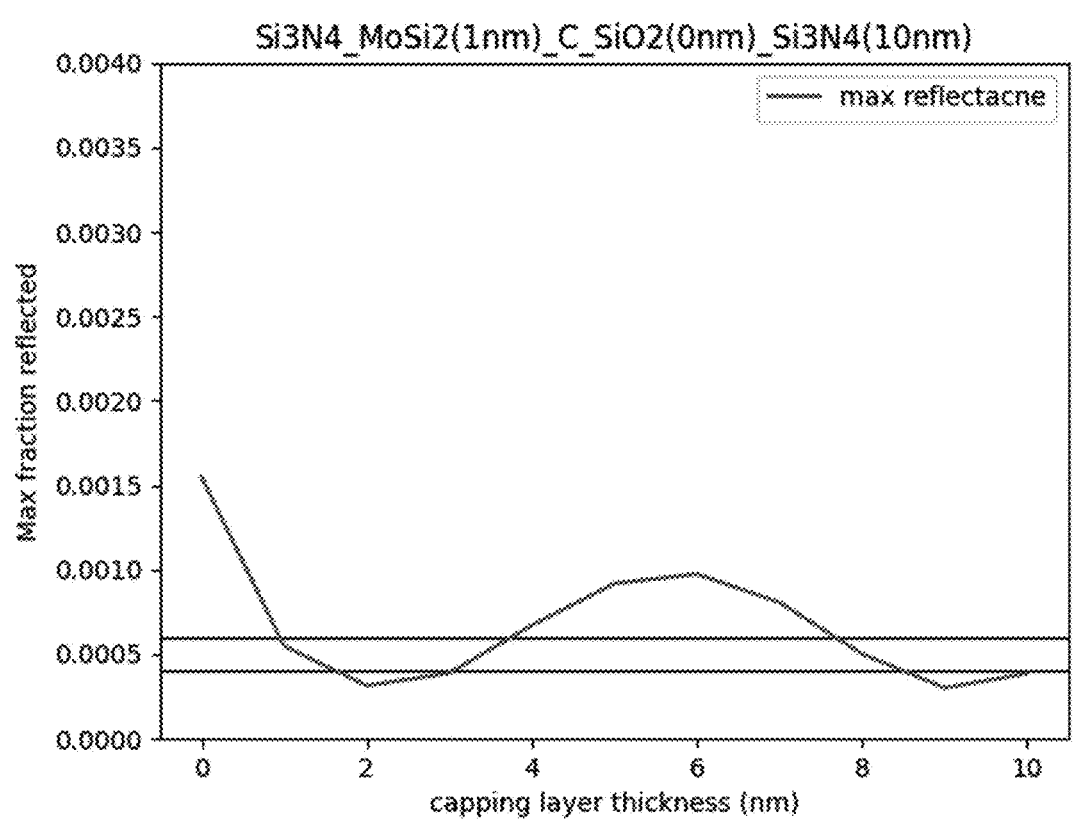

FIGS. 33 to 35 are graphs showing transmittance, reflectance, and maximum reflectance of a pellicle for lithography having a graphene defect healing layer formed of $MoSi_2$ having a thickness of 1 nm according to a ninth embodiment.

Referring to FIGS. 33 to 35, the pellicle according to the ninth embodiment is expressed as $Si_3N_4\_MoSi_2$ (1 nm)_C_$SiO_2$ (0 nm)_$Si_3N_4$ (10 nm).

According to the ninth embodiment, in case that the thickness of the graphene defect healing layer of $MoSi_2$ is 1 nm, the extreme ultraviolet transmittance of 85% or more in an extreme ultraviolet output environment of 350 W or more can be seen when the thickness of the core layer is 5 nm or less.

The pellicle according to the ninth embodiment has a reflectance of 0.0020% or less when the thickness of the core layer is 10 nm or less. In order for the maximum reflectance to be 0.0005%, the thickness of the capping layer needs to be maintained at 1 to 3 nm or 9 to 10 nm.

Figure 36:
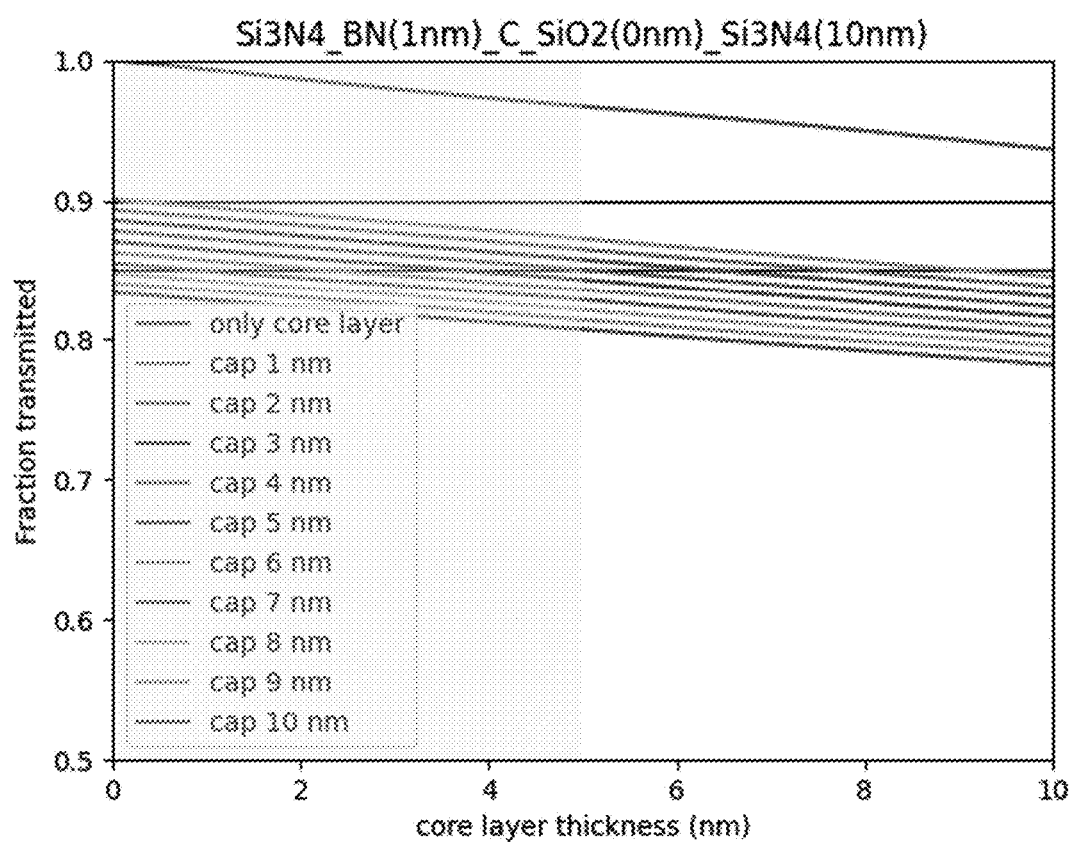
FIGS. 36 to 38 are graphs showing transmittance, reflectance, and maximum reflectance of a pellicle for lithography having a graphene defect healing layer formed of BN having a thickness of 1 nm according to a tenth embodiment.
Figure 37:
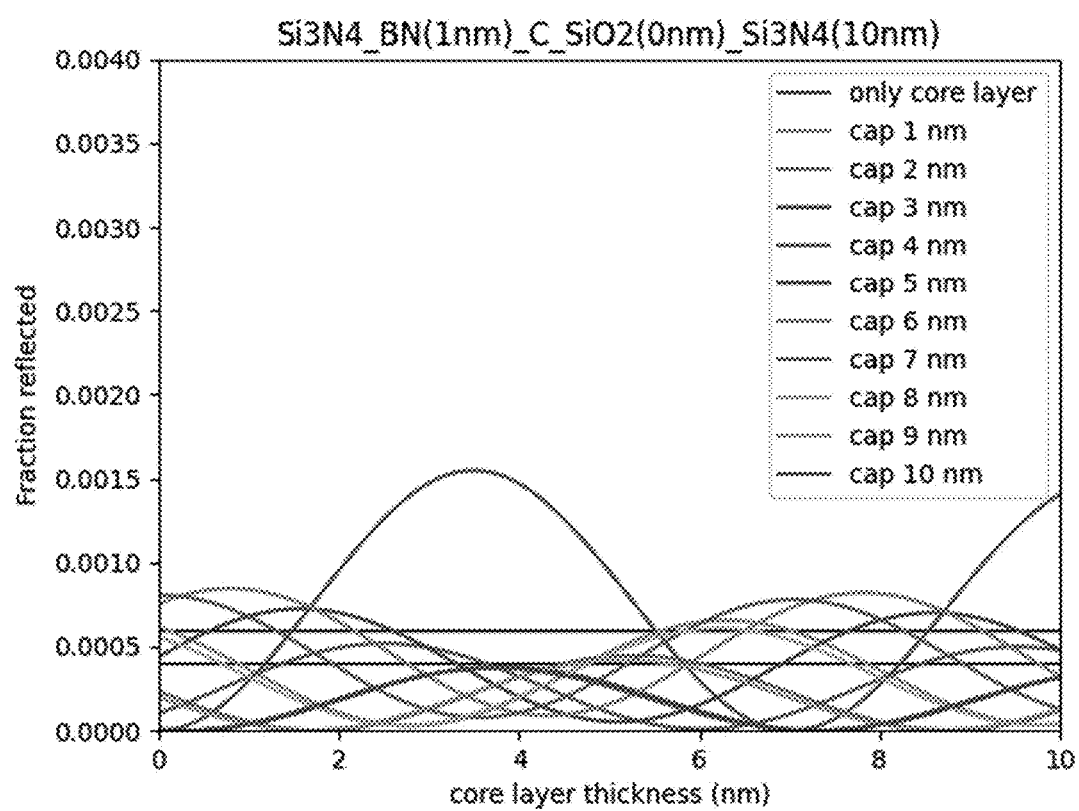
Figure 38:
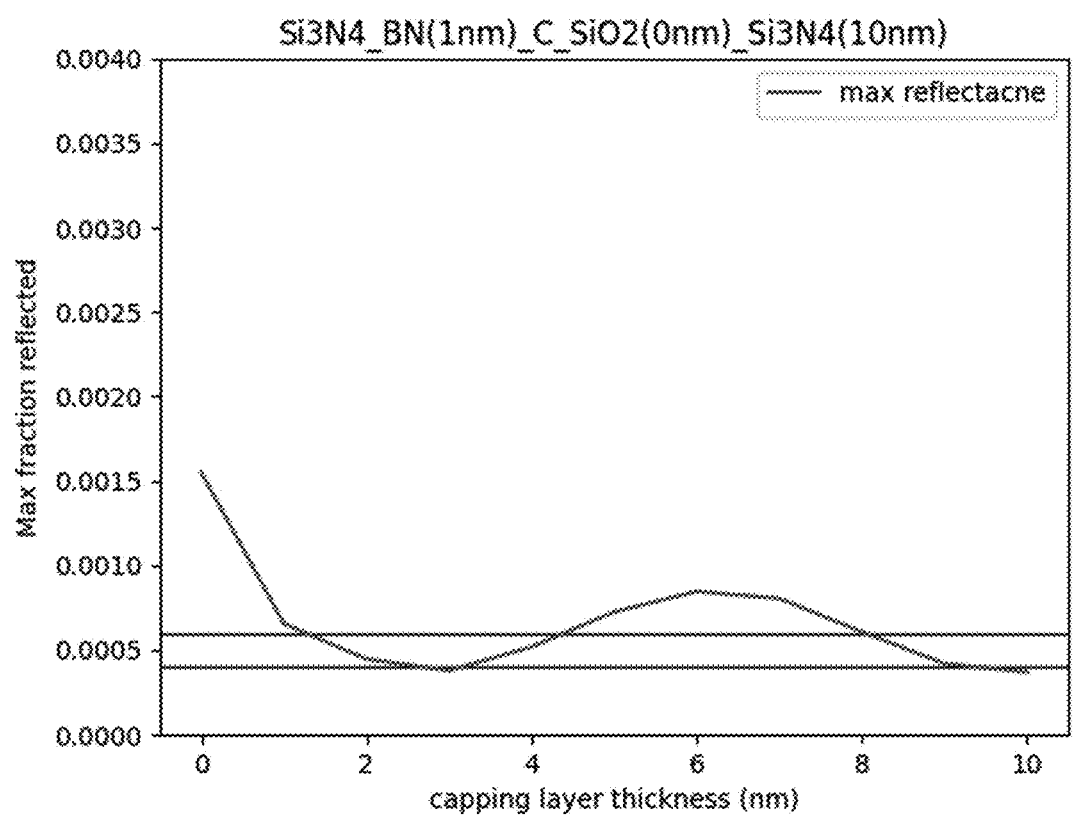

FIGS. 36 to 38 are graphs showing transmittance, reflectance, and maximum reflectance of a pellicle for lithography having a graphene defect healing layer formed of BN having a thickness of 1 nm according to a tenth embodiment.

Referring to FIGS. 36 to 38, the pellicle according to the tenth embodiment is expressed as $Si_3N_4\_BN$ (1 nm)_C_$SiO_2$ (0 nm)_$Si_3N_4$ (10 nm).

According to the tenth embodiment, in case that the thickness of the graphene defect healing layer of BN is 1 nm, the extreme ultraviolet transmittance of 85% or more in an extreme ultraviolet output environment of 350 W or more can be seen when the thickness of the core layer is 5 nm or less.

The pellicle according to the tenth embodiment has a reflectance of 0.0020% or less when the thickness of the core layer is 10 nm or less. In order for the maximum reflectance to be 0.0005%, the thickness of the capping layer needs to be maintained at 2 to 4 nm or 9 to 10 nm.

According to the seventh to tenth embodiments, even if the thickness of the support layer is 10 nm, it is possible to implement an extreme ultraviolet transmittance of 85% or more in an extreme ultraviolet output environment of 350 W or more by adjusting the thicknesses of the graphene defect healing layer and the capping layer, based on the thickness of the core layer of 5 nm.

Next, as shown in FIGS. 39 to 53, eleventh to fifteenth embodiments show the transmittance, reflectance, and maximum reflectance of pellicles including a graphene defect healing layer formed of 1 nm thick $MeO_xN_y$ (Me is one of Si, Al, Ti, Zr, and Hf, x+y=2). The thickness of a support layer is 5 nm.

Figure 39:
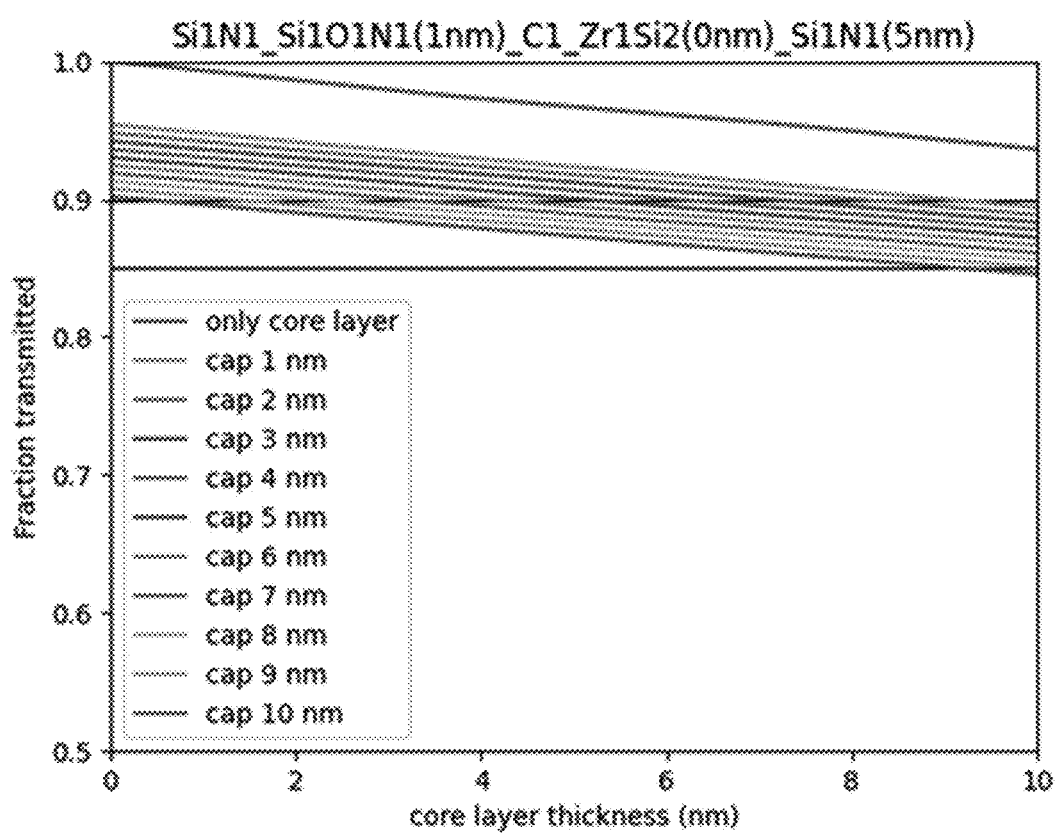
FIGS. 39 to 41 are graphs showing transmittance, reflectance, and maximum reflectance of a pellicle for lithography having a graphene defect healing layer formed of SiON having a thickness of 1 nm according to an eleventh embodiment.
Figure 40:
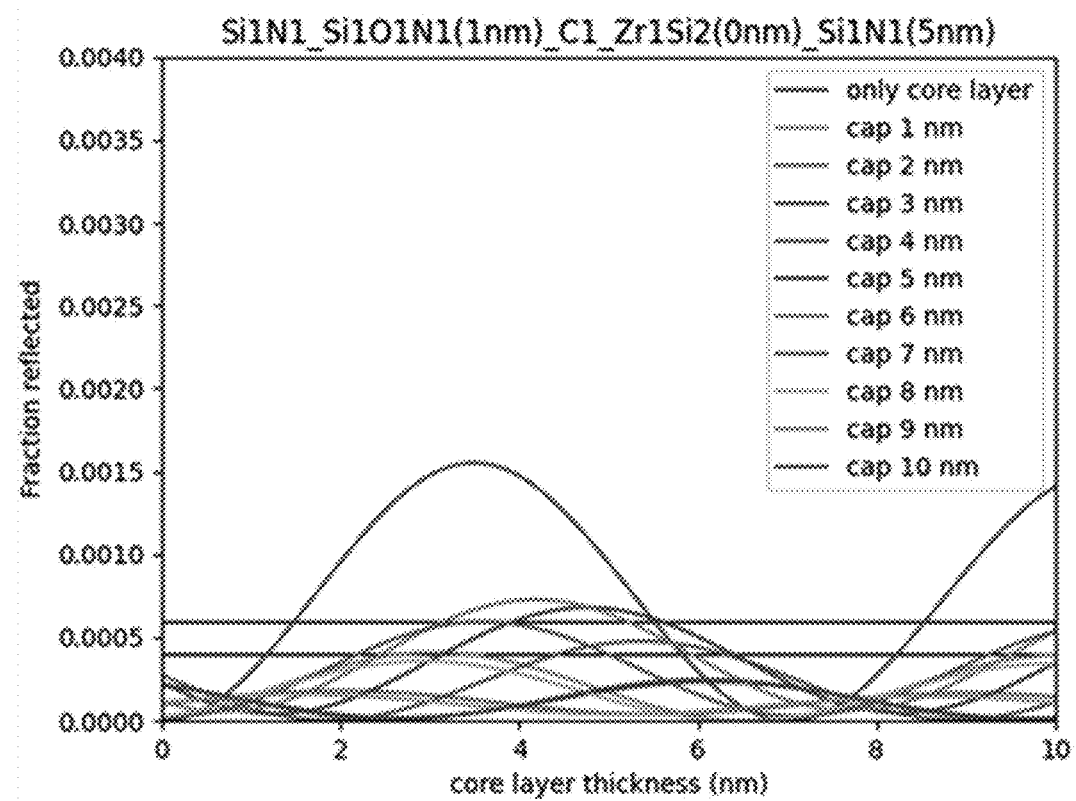
Figure 41:
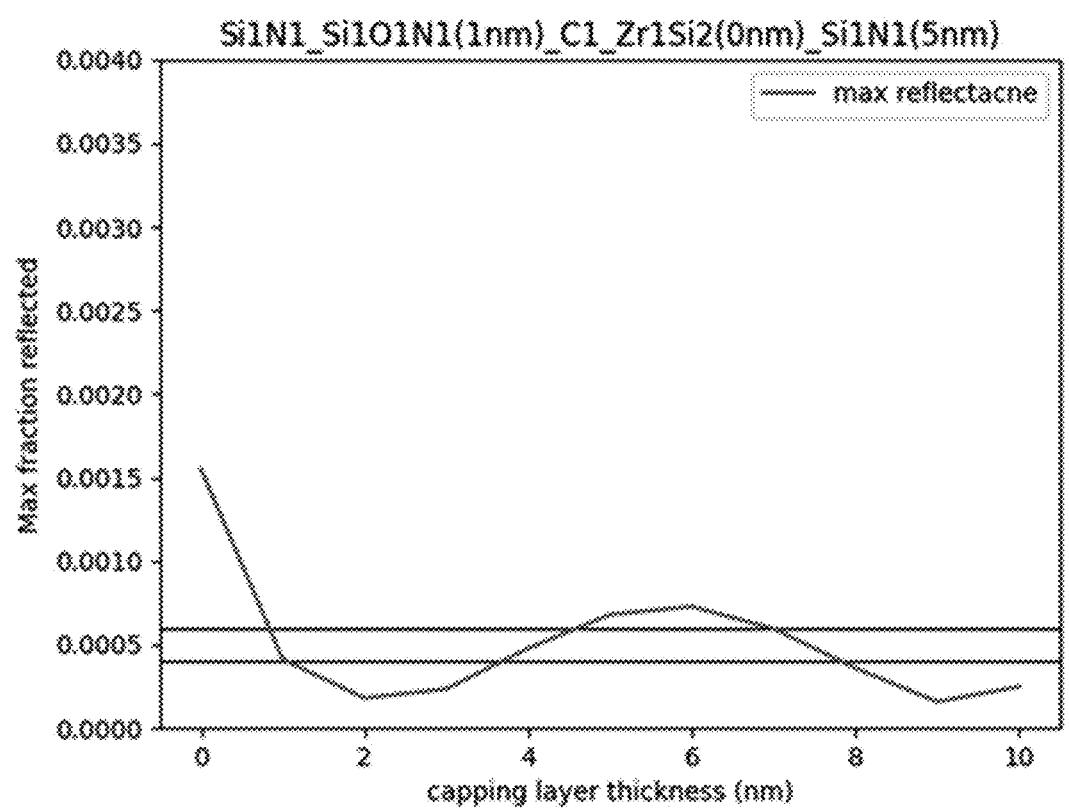

FIGS. 39 to 41 are graphs showing transmittance, reflectance, and maximum reflectance of a pellicle for lithography having a graphene defect healing layer formed of SiON having a thickness of 1 nm according to an eleventh embodiment.

Referring to FIGS. 39 to 41, the pellicle according to the eleventh embodiment is expressed as $Si_1N_1\_Si_1O_1N_1$ (1 nm)_C_$Zr_1Si_2$ (0 nm)_$Si_1N_1$ (5 nm).

According to the eleventh embodiment, in case that the thickness of the graphene defect healing layer of SiON is 1 nm, the extreme ultraviolet transmittance of 90% or more in an extreme ultraviolet output environment of 350 W or more can be seen when the thickness of the core layer is 9 nm or less and the thickness of the capping layer is 10 nm or less.

The pellicle according to the eleventh embodiment has a reflectance of 0.0015% or less when the thickness of the core layer is 10 nm or less. In order for the maximum reflectance to be 0.0005%, the thickness of the capping layer needs to be maintained at 1 to 4 nm or 7 to 10 nm.

In the pellicle according to the eleventh embodiment, the extreme ultraviolet transmittance of 90% or more in an extreme ultraviolet output environment of 350 W or more can be seen when the thickness of the support layer is 10 nm or less. Therefore, in the pellicle according to the eleventh embodiment, the thickness of the support layer needs to be 10 nm or less.

Figure 42:
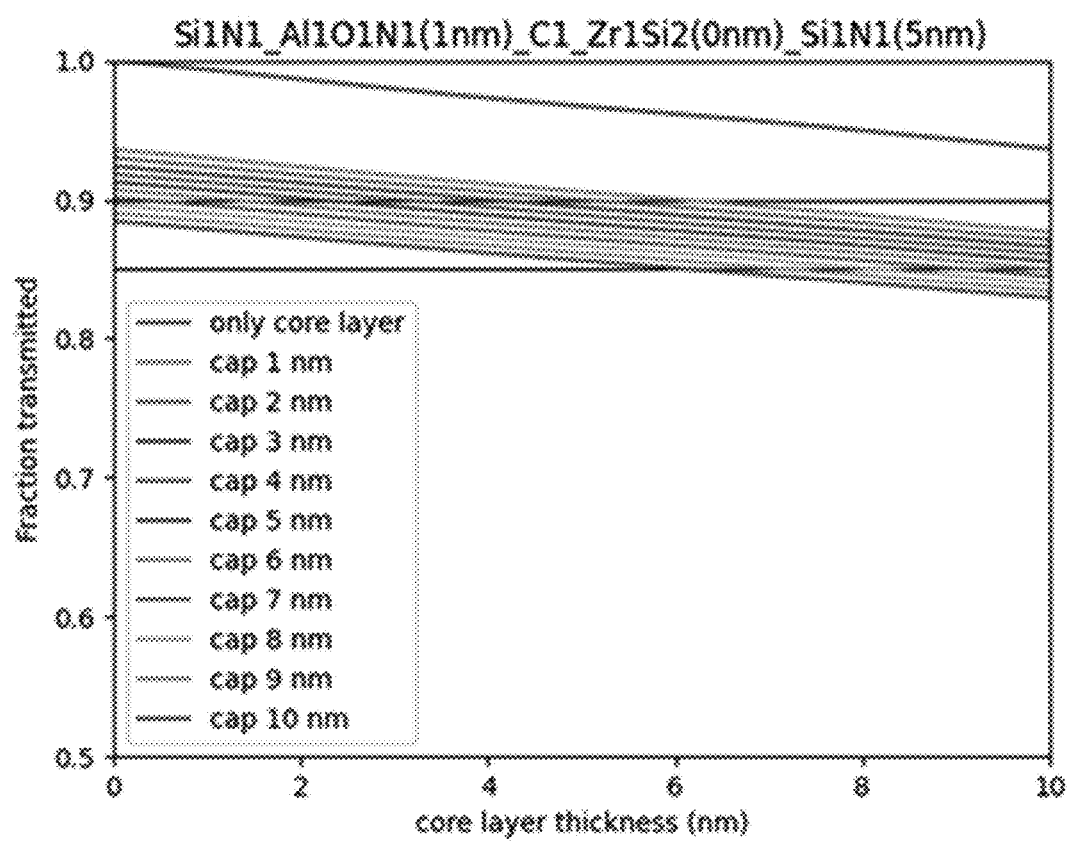
FIGS. 42 to 44 are graphs showing transmittance, reflectance, and maximum reflectance of a pellicle for lithography having a graphene defect healing layer formed of AlON having a thickness of 1 nm according to a twelfth embodiment.
Figure 43:
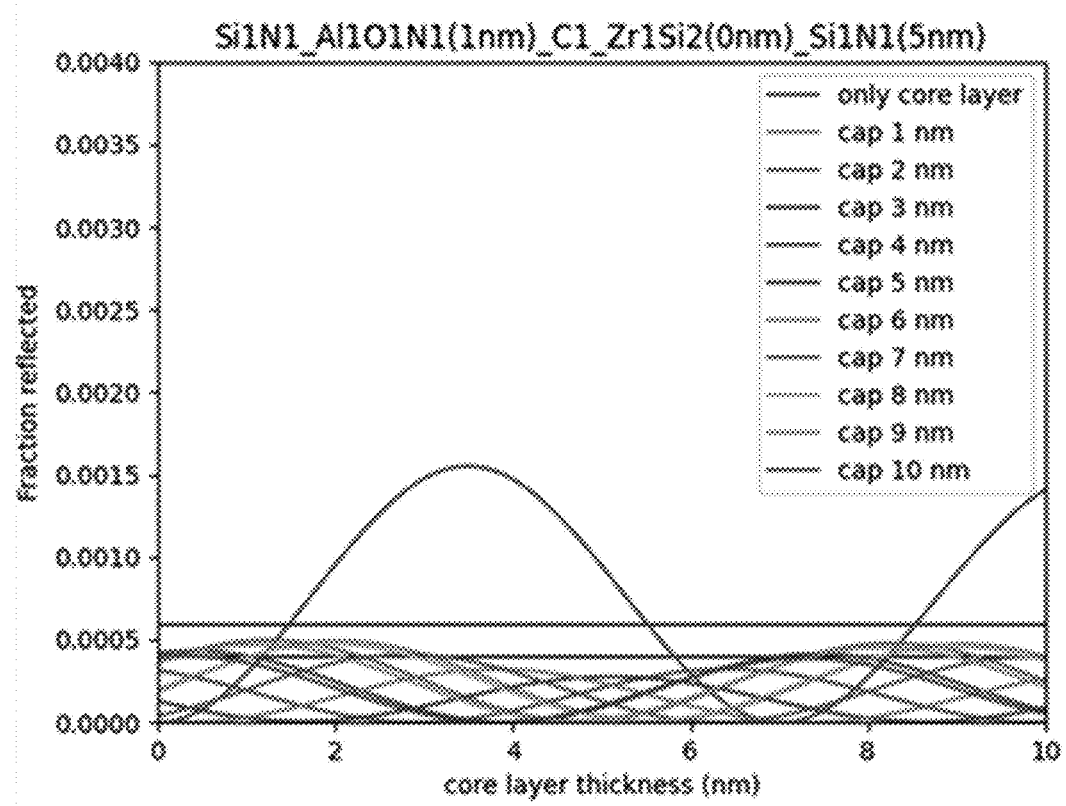
Figure 44:
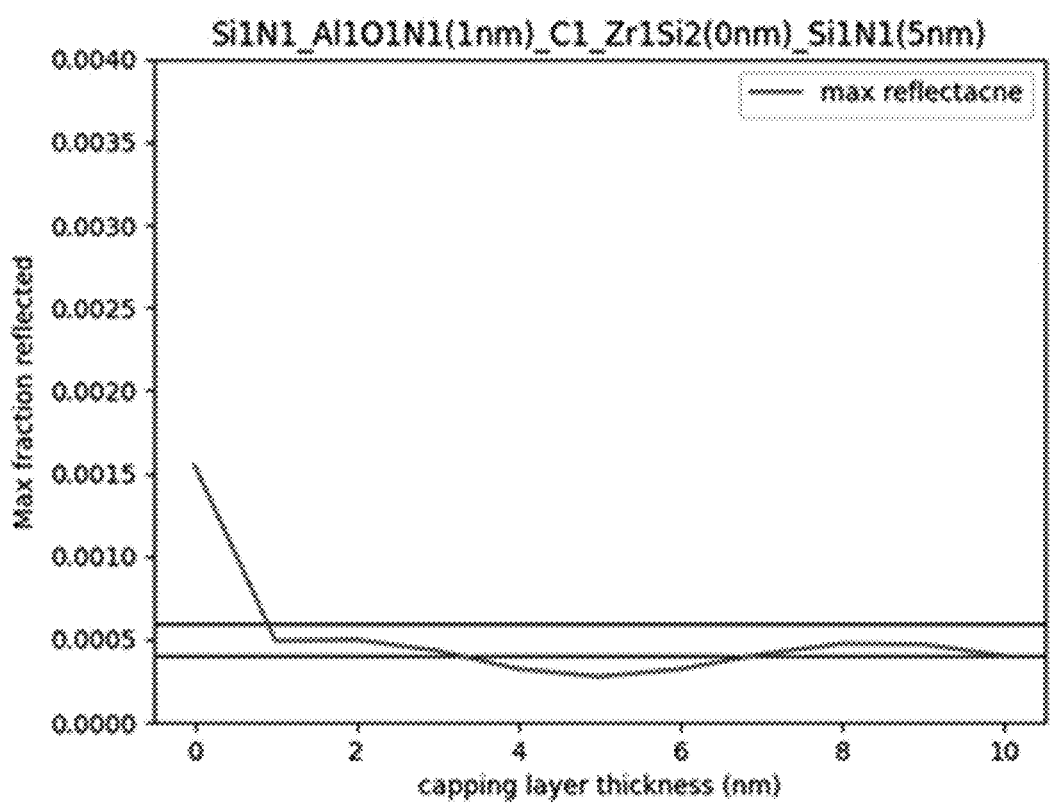

FIGS. 42 to 44 are graphs showing transmittance, reflectance, and maximum reflectance of a pellicle for lithography having a graphene defect healing layer formed of AlON having a thickness of 1 nm according to a twelfth embodiment.

Referring to FIGS. 42 to 44, the pellicle according to the twelfth embodiment is expressed as $Si_1N_1\_Al_1O_1N_1$ (1 nm)_C_$Zr_1Si_2$ (0 nm)_$Si_1N_1$ (5 nm).

According to the twelfth embodiment, in case that the thickness of the graphene defect healing layer of AlON is 1 nm, the extreme ultraviolet transmittance of 90% or more in an extreme ultraviolet output environment of 350 W or more can be seen when the thickness of the core layer is 6 nm or less and the thickness of the capping layer is 8 nm or less.

The pellicle according to the twelfth embodiment has a reflectance of 0.0015% or less when the thickness of the core layer is 10 nm or less. In order for the maximum reflectance to be 0.0005%, the thickness of the capping layer needs to be maintained at 1 to 10 nm.

In the pellicle according to the twelfth embodiment, the extreme ultraviolet transmittance of 90% or more in an extreme ultraviolet output environment of 350 W or more can be seen when the thickness of the support layer is 10 nm or less. Therefore, in the pellicle according to the twelfth embodiment, the thickness of the support layer needs to be 10 nm or less.

Figure 45:
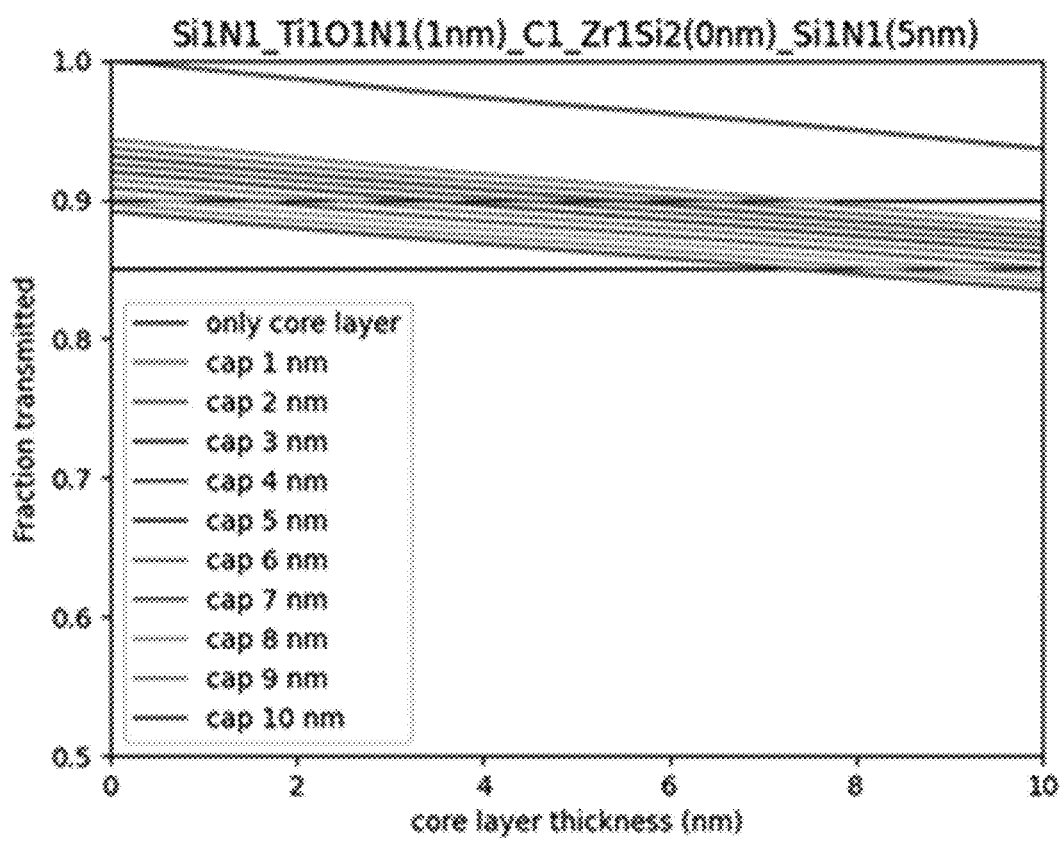
FIGS. 45 to 47 are graphs showing transmittance, reflectance, and maximum reflectance of a pellicle for lithography having a graphene defect healing layer formed of TiON having a thickness of 1 nm according to a thirteenth embodiment.
Figure 46:
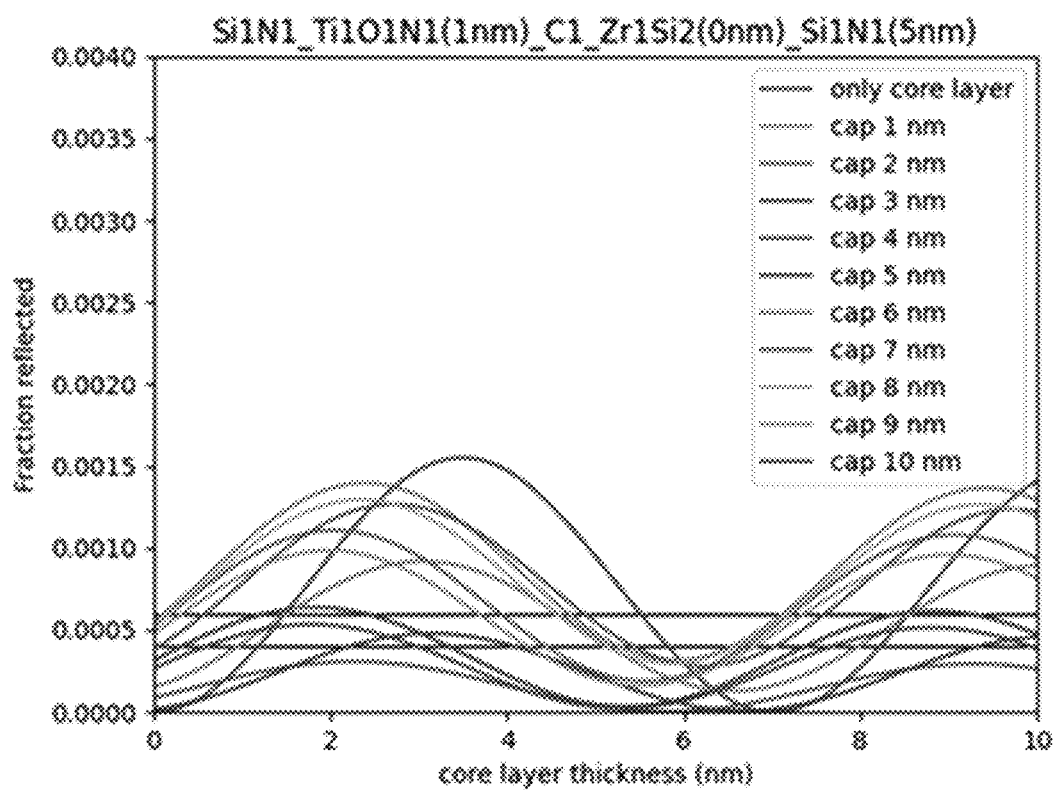
Figure 47:
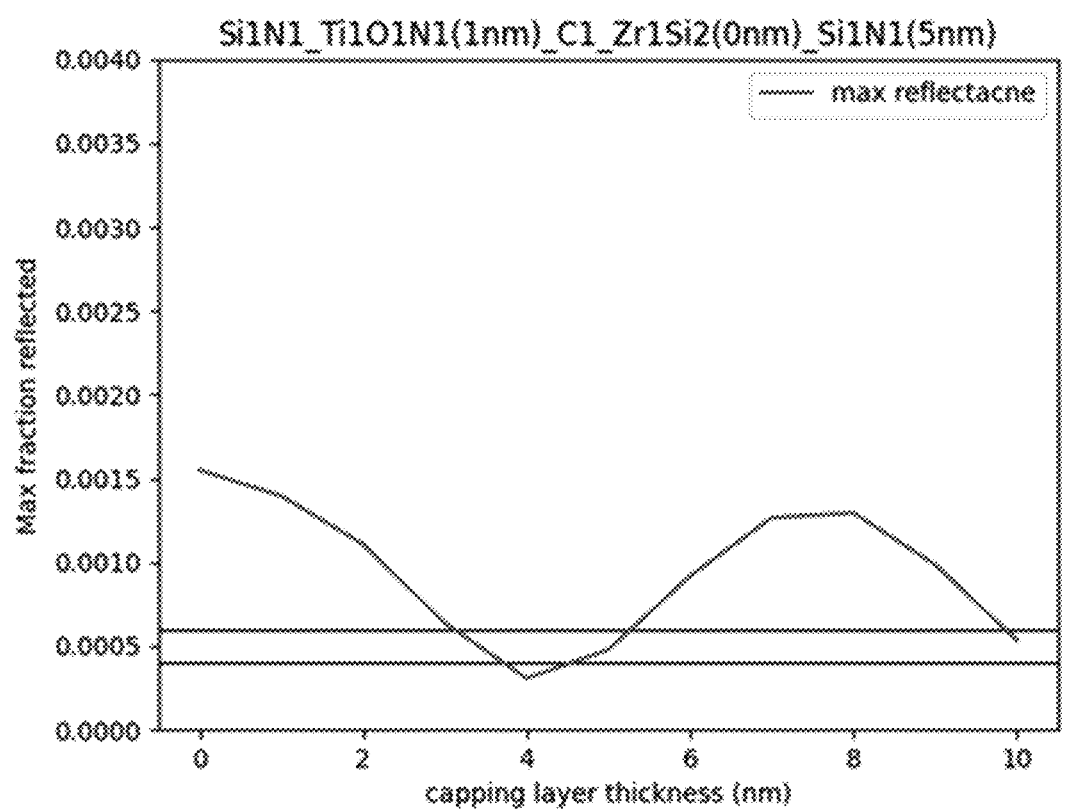

FIGS. 45 to 47 are graphs showing transmittance, reflectance, and maximum reflectance of a pellicle for lithography having a graphene defect healing layer formed of TiON having a thickness of 1 nm according to a thirteenth embodiment.

Referring to FIGS. 45 to 47, the pellicle according to the thirteenth embodiment is expressed as $Si_1N_1\_Ti_1O_1N_1$ (1 nm)$\_C\_Zr_1Si_2$ (0 nm)$\_Si_1N_1$ (5 nm).

According to the thirteenth embodiment, in case that the thickness of the graphene defect healing layer of TiON is 1 nm, the extreme ultraviolet transmittance of 90% or more in an extreme ultraviolet output environment of 350 W or more can be seen when the thickness of the core layer is 7 nm or less and the thickness of the capping layer is 8 nm or less.

The pellicle according to the thirteenth embodiment has a reflectance of 0.0015% or less when the thickness of the core layer is 10 nm or less. In order for the maximum reflectance to be 0.0005%, the thickness of the capping layer needs to be maintained at 3 to 5 nm.

In the pellicle according to the thirteenth embodiment, the extreme ultraviolet transmittance of 90% or more in an extreme ultraviolet output environment of 350 W or more can be seen when the thickness of the support layer is 10 nm or less. Therefore, in the pellicle according to the thirteenth embodiment, the thickness of the support layer needs to be 10 nm or less.

Figure 48:
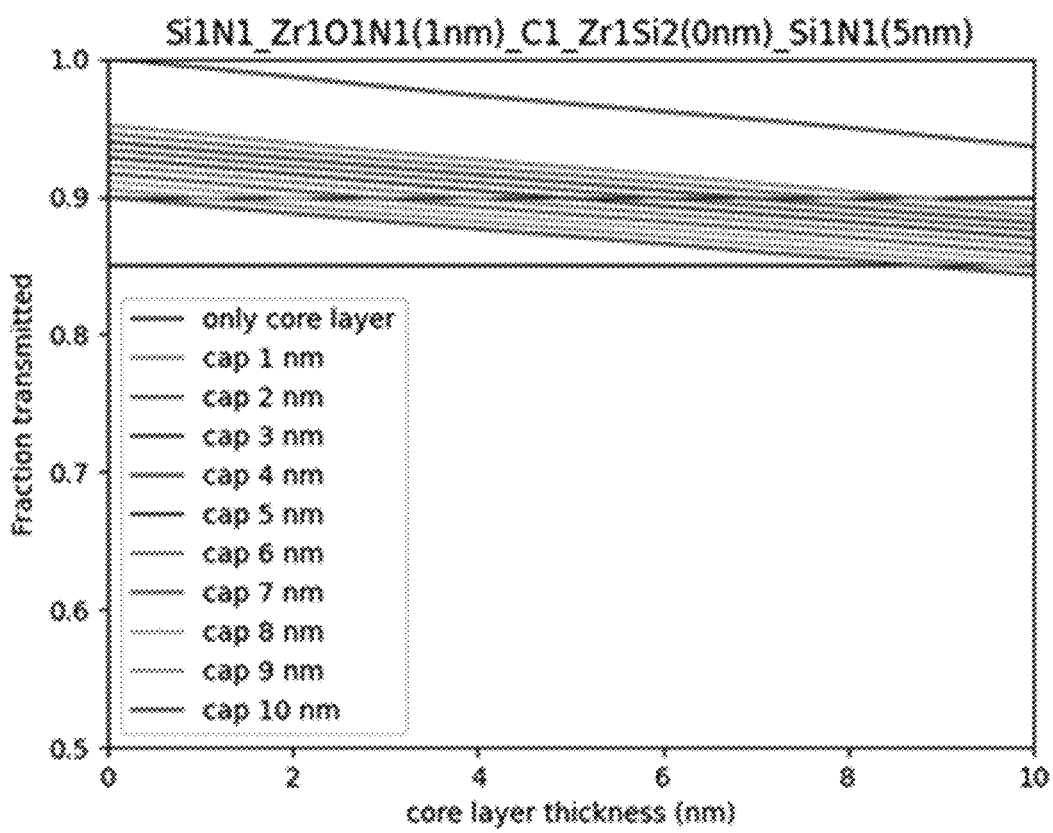
FIGS. 48 to 50 are graphs showing transmittance, reflectance, and maximum reflectance of a pellicle for lithography having a graphene defect healing layer formed of ZrON having a thickness of 1 nm according to a fourteenth embodiment.
Figure 49:
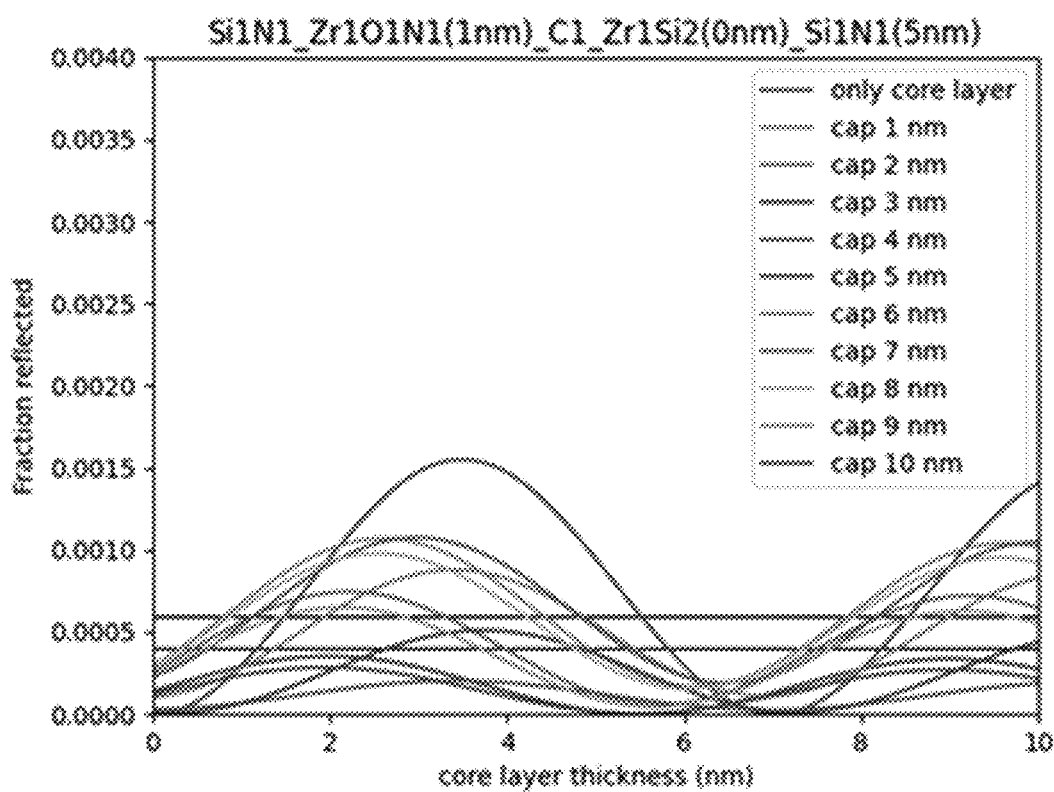
Figure 50:
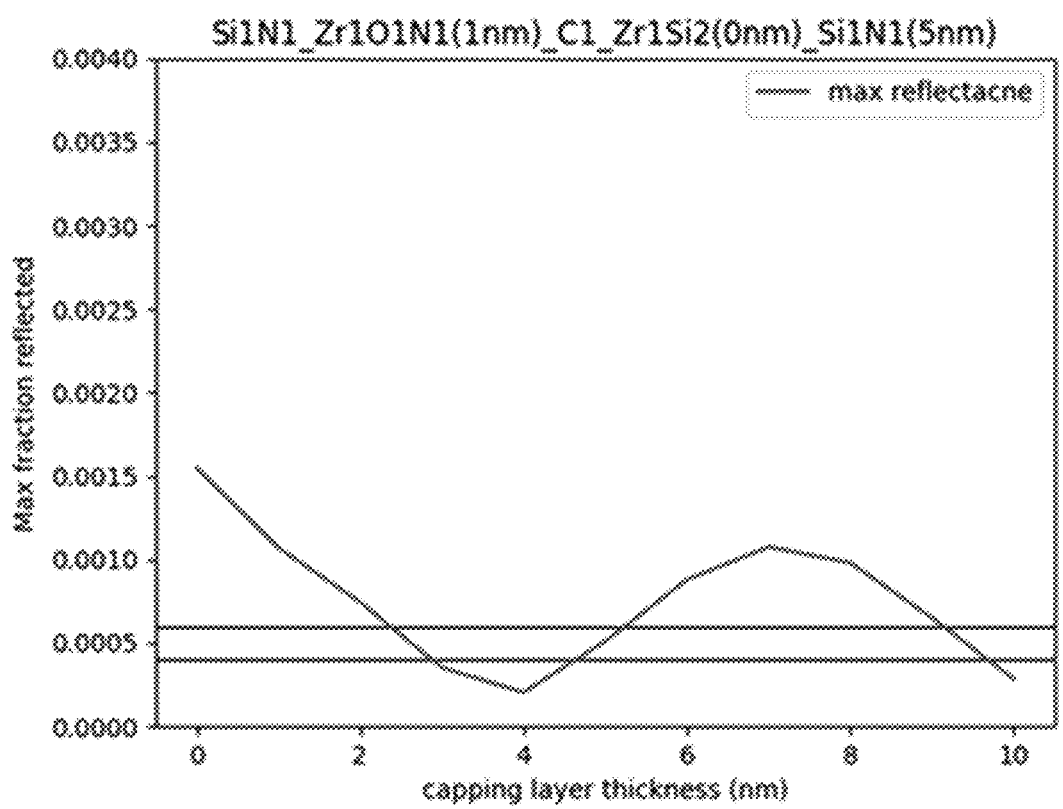

FIGS. 48 to 50 are graphs showing transmittance, reflectance, and maximum reflectance of a pellicle for lithography having a graphene defect healing layer formed of ZrON having a thickness of 1 nm according to a fourteenth embodiment.

Referring to FIGS. 48 to 50, the pellicle according to the fourteenth embodiment is expressed as $Si_1N_1\_Zr_1O_1N_1$ (1 nm)$\_C\_Zr_1Si_2$ (0 nm)$\_Si_1N_1$ (5 nm).

According to the fourteenth embodiment, in case that the thickness of the graphene defect healing layer of ZrON is 1 nm, the extreme ultraviolet transmittance of 90% or more in an extreme ultraviolet output environment of 350 W or more can be seen when the thickness of the core layer is 9 nm or less and the thickness of the capping layer is 10 nm or less.

The pellicle according to the fourteenth embodiment has a reflectance of 0.0015% or less when the thickness of the core layer is 10 nm or less. In order for the maximum reflectance to be 0.0005%, the thickness of the capping layer needs to be maintained at 3 to 5 nm or 9 to 10 nm.

In the pellicle according to the fourteenth embodiment, the extreme ultraviolet transmittance of 90% or more in an extreme ultraviolet output environment of 350 W or more can be seen when the thickness of the support layer is 10 nm or less. Therefore, in the pellicle according to the fourteenth embodiment, the thickness of the support layer needs to be 10 nm or less.

Figure 51:
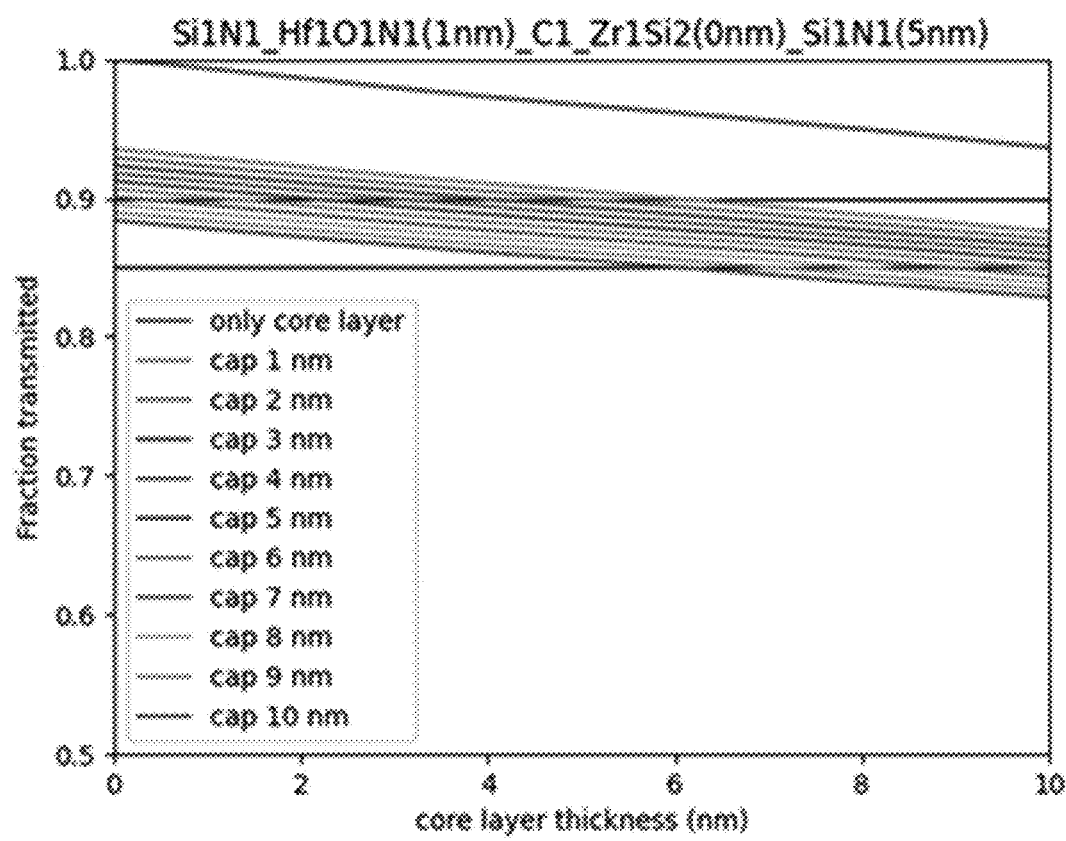
FIGS. 51 to 53 are graphs showing transmittance, reflectance, and maximum reflectance of a pellicle for lithography having a graphene defect healing layer formed of HfON having a thickness of 1 nm according to a fifteenth embodiment.
Figure 52:
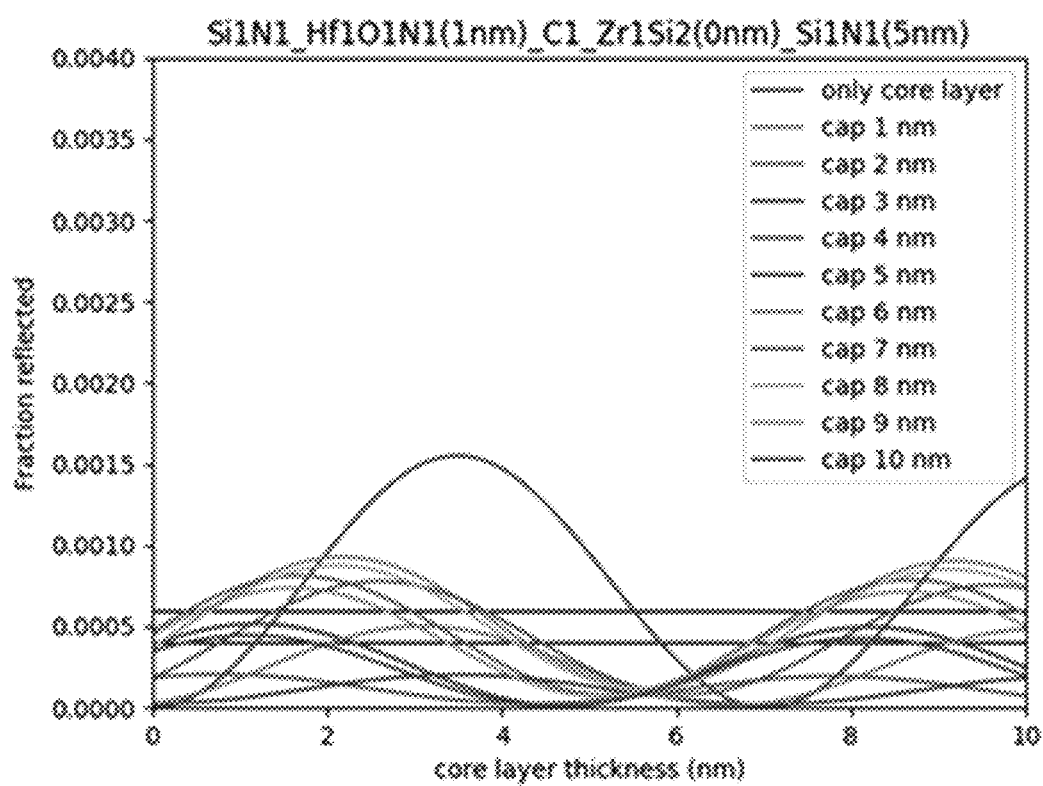
Figure 53:
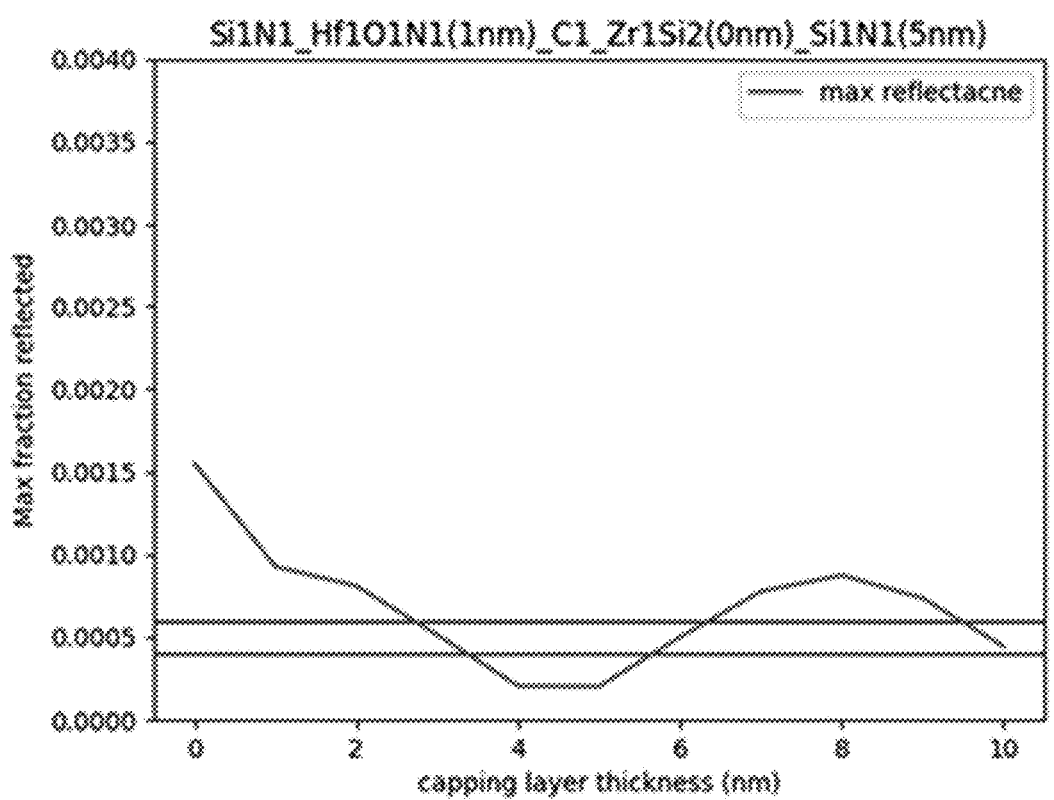

FIGS. 51 to 53 are graphs showing transmittance, reflectance, and maximum reflectance of a pellicle for lithography having a graphene defect healing layer formed of HfON having a thickness of 1 nm according to a fifteenth embodiment.

Referring to FIGS. 51 to 53, the pellicle according to the fifteenth embodiment is expressed as $Si_1N_1\_Hf_1O_1N_1$ (1 nm)$\_C\_Zr_1Si_2$ (0 nm)$\_Si_1N_1$ (5 nm).

According to the fifteenth embodiment, in case that the thickness of the graphene defect healing layer of HfON is 1 nm, the extreme ultraviolet transmittance of 90% or more in an extreme ultraviolet output environment of 350 W or more can be seen when the thickness of the core layer is 6 nm or less and the thickness of the capping layer is 8 nm or less.

The pellicle according to the fifteenth embodiment has a reflectance of 0.0015% or less when the thickness of the core layer is 10 nm or less. In order for the maximum reflectance to be 0.0005%, the thickness of the capping layer needs to be maintained at 3 to 7 nm or 9 to 10 nm.

In the pellicle according to the fifteenth embodiment, the extreme ultraviolet transmittance of 90% or more in an extreme ultraviolet output environment of 350 W or more can be seen when the thickness of the support layer is 10 nm or less. Therefore, in the pellicle according to the fifteenth embodiment, the thickness of the support layer needs to be 10 nm or less.

While the present disclosure has been particularly shown and described with reference to an exemplary embodiment thereof, it will be understood by those skilled in the art that various changes in form and details may be made therein without departing from the scope of the present disclosure as defined by the appended claims.

What is claimed is:

1. A method for manufacturing a pellicle for extreme ultraviolet lithography including a graphene defect healing layer, the method comprising:
    forming a support layer of a silicon nitride material on a silicon substrate;
    forming a core layer of a graphene material on the support layer;
    forming a graphene defect healing layer on the core layer by selectively forming a material of $MeO_xN_y$ (Me is one of Si, Al, Ti, Zr, and Hf, x+y=2) at a grain boundary of the core layer in an atomic layer deposition (ALD) process using heat in order to heal defects generated in graphene forming the core layer without additional damage to the graphene;
    forming a capping layer on the graphene defect healing layer in the ALD process; and
    removing a central portion of the silicon substrate under the support layer to form an opening through which the support layer is partially exposed,
    wherein forming the core layer includes:
    forming a few-layer graphene on the support layer;
    forming a metal catalyst layer on the few-layer graphene;
    forming an amorphous carbon layer on the metal catalyst layer; and
    directly growing a multi-layer graphene from the few-layer graphene used as a seed layer by interlayer exchange between the metal catalyst layer and the amorphous carbon layer through heat treatment, wherein carbon in the amorphous carbon layer passes through the metal catalyst layer and is moved to the few-layer graphene.

2. The method of claim 1, wherein the support layer is formed to a thickness of 10 nm or less in a low pressure chemical vapor deposition (LPCVD) process.

3. The method of claim 1, further comprising:
    removing a residue generated in a process of forming the core layer by performing ozone pre-treatment through the ALD process between forming the core layer and forming the graphene defect healing layer.

4. The method of claim 1, wherein the graphene defect healing layer is formed to a thickness of 1 nm to 3 nm in the ALD process using heat.

5. The method of claim 1, wherein a material of the graphene defect healing layer is a three-component material containing Me, O, and N.

6. The method of claim 1, wherein a material of the graphene defect healing layer is one of SiON, AlON, TiON, ZrON, and HfON.

7. The method of claim 1, wherein the capping layer includes $SiN_x$, SiC, $B_4C$, BN, or $MoSi_2$.

8. The method of claim 7, wherein the capping layer is formed to a thickness of 10 nm or less in the ALD process.

* * * * *